(12) United States Patent
Willett

(10) Patent No.: US 9,748,473 B2
(45) Date of Patent: Aug. 29, 2017

(54) QUANTUM WELL DEVICE WITH LATERAL ELECTRODES

(71) Applicant: Alcatel Lucent, Boulogne Billancourt (FR)

(72) Inventor: Robert L. Willett, Warren, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/619,505

(22) Filed: Feb. 11, 2015

(65) Prior Publication Data

US 2015/0155478 A1 Jun. 4, 2015

Related U.S. Application Data

(62) Division of application No. 13/349,056, filed on Jan. 12, 2012, now Pat. No. 8,987,703.

(60) Provisional application No. 61/566,357, filed on Dec. 2, 2011.

(51) Int. Cl.
| | |
|---|---|
| *H01L 43/14* | (2006.01) |
| *H01L 43/06* | (2006.01) |
| *G06N 99/00* | (2010.01) |
| *H01L 43/04* | (2006.01) |

(52) U.S. Cl.
CPC .......... *H01L 43/14* (2013.01); *G06N 99/002* (2013.01); *H01L 43/04* (2013.01); *H01L 43/065* (2013.01)

(58) Field of Classification Search
CPC ....... H01L 43/14; H01L 43/04; H01L 43/065; G06N 99/002
See application file for complete search history.

(56) References Cited

U.S. PATENT DOCUMENTS

| | | |
|---|---|---|
| 7,394,092 B2 | 7/2008 | Freedman et al. |
| 7,576,353 B2 | 8/2009 | Diduck et al. |
| 7,781,801 B2 | 8/2010 | Willett |
| 7,960,714 B2 | 6/2011 | Baldwin et al. |
| (Continued) | | |

OTHER PUBLICATIONS

Sankar Das Sarma et al., "Topologically Protected Qubits from a Possible Non-Abelian Fractional Quantum Hall State", Physical Review Letters, 94 (2005), pp. 166802-1 through 166802-4.

(Continued)

*Primary Examiner* — Ermias Woldegeorgis
(74) *Attorney, Agent, or Firm* — John F. McCabe

(57) ABSTRACT

An apparatus includes a substrate having a planar top surface, a sequence of crystalline semiconductor layers located on the planar surface, and first and second sets of electrodes located over the sequence. The sequence of crystalline semiconductor layers has a 2D quantum well therein. The first set of electrodes border opposite sides of a lateral region of the sequence and are controllable to vary a width of a non-depleted portion of the quantum well along the top surface. The second set of electrodes border first and second channels between the lateral region and first and second adjacent lateral areas of the sequence and are controllable to vary widths of non-depleted segments of the quantum well in the channels. The electrodes are located such that straight lines connecting the first and second lateral areas via the channels either pass between one of the electrodes and the substrate or are misaligned to an effective [1 1̄ 0] lattice direction of the sequence.

11 Claims, 13 Drawing Sheets

(56) References Cited

U.S. PATENT DOCUMENTS

| | | | |
|---|---|---|---|
| 2005/0021927 A1 | 1/2005 | Machida et al. | |
| 2008/0073668 A1 | 3/2008 | Willett | |
| 2008/0136454 A1 | 6/2008 | Diduck et al. | |
| 2008/0224726 A1 | 9/2008 | Freedman et al. | |
| 2010/0155697 A1* | 6/2010 | Baldwin et al. | 257/14 |
| 2010/0308302 A1 | 12/2010 | Baldwin et al. | |
| 2011/0212553 A1 | 9/2011 | Baldwin et al. | |

OTHER PUBLICATIONS

Willett, R. L. et al., "Anisotropic Disorder in High-Mobility 2D heterostructures and its Correlation to Electron Transport", Physical Review Letters, vol. 87, No. 12, Sep. 17, 2001, pp. 126803-1-126803-4.
PCT International Search Report, PCT/US2012/064028, International Filing Date, Nov. 8, 2012, Date of Mailing Mar. 29, 2013.
Stern, A. et al, "Proposed Experiments to Probe the Non-Abelian v=5/2 Quantum Hall State", Phys. Rev. Lett. 96 (2006), pp. 016802-1 thru 016802-4.
Bonderson, P. et al., "Detecting Non-Abelian Satistics in the v=5/2 Fractional Quantum Hall State", Phys. Rev. Lett. 96, (Jan. 2006), pp. 016803-1 thru 016803-4.
Van Loosdrecht, P. et al, "Aharonov-Bohm effect in a singly connected point contact", Phys. Rev. 13, vol. 38, No. 14, (Nov. 1988), pp. 10162-10165.
Van Wees, B.J. et al,"Observation of Zero-Dimensional States in a One-Dimensional Electron Interferometer", Phys. Rev. Lett. vol. 62, No, 21, May 22, 1989, pp. 2523-2526.
Ji, Y. et al, "An electronic Mach-Zehnder Interferometer", Nature, vol. 422, Mar. 27, 2003, pp. 415-418.
Roulleau, P. et al, "Direct Measurement of the Coherence Length of Edge States in the Integer Quantum Hall Regime", Phys. Rev. Lett. 100, (2008) pp. 126802-1 thru 126802-4.
Camino, F.E. et al, "Aharonov-Bohm Superperiod in a Laughlin Quasiparticle Interferometer", Phys. Rev. Lett, 95, Dec. 9, 2005, pp. 246802-1 thru 246802-4.
Godfrey, M.D. et al, "Aharanov-Bohm Oscillations in Quantum Hall Corrals", available on line at: http://arxiv.org/abs/0708.2448v1, (2007), 5 pgs.
Willett, R.L. et al, "Confinement of fractional quantum Hall states in narrow conducting channels", Appl. Phys. Lett. 91, (2007) pp. 052105-1 thru 052105-3.
Rosenow, B. et al, "Influence of Interactions on Flux and Back-Gate Period of Quantum Hall Interferometers", Phys. Rev. Lett. 98, Mar. 2007, pp. 106801-1 thru 106801-4.
Beenaker, C.W. et al, Article: "Quantum Transport in Semiconductor Nanostructures" in Solid State Phsyics, Henry Ehrenreich and David Turnbull,eds., vol. 44, 1991, pp. 1-228.
Dolev, M. et al, "Observation of a quarter of an electron charge at the v=5/2 quantum Hall state", Nature, vol. 452, Apr. 17, 2008, pp. 829-835.
Radu, I. et al, "Quasi-Particle Properties from Tunneling in the v-5/2 Fractional Quantum Hall State", Science, vol. 320, May 16, 2008, pp. 899-902.
Chamon, C. de C. et al, "Two point-contact interferometer for quantum hall systems", Phys. Rev. B, vol. 55, No. 4, Jan. 1997, pp. 2331-2343.
Fradkin, E. et al, "A Chern-Simons effective field theory fro the Pfaffian quantum Hall state", Nucl. Phys. B 516, Jan. 1998, pp. 704-718.
Davies, J. "The Physics of Low-Dimensional Seminconductors an Introduction", 1998, Title, Copyright, vii-xi, pp. 80-117,118-149, 206-248, 329-370.,Cambridge Univ Press, UK.
Composite Fermions: A Unified View of the Quantum Hall Regime, edited by O. Heinorien, World Scientific, Singapore, 1998, Title, copyright, v-xi, pp. 1-491.
Pan, W. et al, "Fractional Quantum Hall Effect of Composite Fermions", available online at: http://arXiv.org.abs.cond-mat/0303429v1 [cond-mat.mes-hall], Mar. 20, 2003, 7 pgs.

Baldwin, K.W. et al, "Quantum Well Device", Filing Date, May 28, 2010, U.S. Appl. No. 12/789,987, 20 pgs.
Willett, R.L. et al., "Observation of an even-denominator quantum number in the fractional quantum Hall Effect", Phys Rev, Letters, vol, 59, No. 15, Oct. 1987, pp. 1776-1779.
Moore, G. et al, "Nonabelions in the Fractional Quantum Hall Effect", Nuclear Physics B, vol. 360, Issue 2-3, pp. 362-396, (1991).
Haldane, F.D.M., et al, "Spin-singlet wave function for the half-integral quantum Hall effect", Phys. Rev. Lett., vol. 60, No. 10, Mar. 1998, pp. 956-959.
Kitaev, A.Y. "Fault tolerant quantum computation by anyons", available online: http://arxiv.org/abs/quant-ph/9707021, pp. 1-27.
Gamez, G. et al., "v = 5/2 Fractional Quantum Hall State in Low-Mobility Electron Systems: Different Rates of Disorder", arXiv:1101.5856v1 [cond-mat.mes-hail], Jan. 31, 2011, 1-5.
Willett, R. L., "Experimental evidence for composite fermions", Advances in Physics, Europhysics Journal, vol. 46, No. 5, Sep./Oct. 1997, pp. 447-544.
Tsui, D. C. et al., "Two-Dimensional Magnetotransport in the Extreme Quantum Limit", Physical Review Letters, vol. 48, No. 22, May 31, 1982, pp. 1559-1562.
Willet, R. et al., "Observation of an Even-Denominator Quantum Number in the Fractional Quantum Hall Effect", Physical Review Letters, vol. 59, No. 15, Oct. 12, 1987, pp. 1776-1779.
Pan, W. et al., "Exact Quantization of Even-Denominator Fractional Quantum Hall State at v = 5/2 Landau Level Filling Factor", (preprint for article published at Phys. Rev. Lett. 83, 3530 (1999)) available online at lanl.arXiv.org, arXiv:cond-mat/9907356vl, [cond-mat.mes-hall] Jul. 23, 1999, 5 pgs.
Eisenstein, J.P. et al., "Insulating and Fractional Quantum Hall States in the First Excited Landau Level", Physical Review Letters, vol. 88, No. 7, Feb. 18, 2002, pp. 076801-1-076801-4.
Moore, G. et al., "Nonabelions in the Fractional Quantum Hall Effect", Nuclear Physics B, vol. 360, (1991), pp. 362-396.
Greiter, M. et al., "Paired Hall states", Nuclear Physics B, vol. 374, (1992), pp. 567-614.
Nayak, C. et al., "2n Quasihole States Realize 2" [1]-Dimensional Spinor Braiding Statistics in Paired Quantum Hall States (preprint for article published at Nucl. Phys, B479, 529 (1996)), available online at lanl.arXiv.org, arXiv:cond-mat/9605145vl, May 23, 1996, 38 pgs.
Read, N. et al., "Paired states of fermions in two dimensions with breaking of parity and time-reversal symmetries, and the fractional quantum Hall effect", (preprint for article published at Phys. Rev. B, 61, 10267 (2000)), available online at lanl.arXiv.org, arXiv:cond-mat/9906453v3 [cond-mat.mes-hall], Jan. 24, 2000, 35 pgs.
Bonderson, P. et al., "Plasma Analogy and Non-Abelian Statistics for lsing-type Quantum Hall States", (preprint for article published at Phys. Rev. B, 83, 075303 (2011)), available online at lanl.arXiv.org, arXiv:1008.5194v2 [cond-mat.str-el], Feb. 2, 2011, 68 pgs.
Chamon, C. De C. et al., "Two point-contact interferometer for quantum Hall systems", (preprint for article published at Phys. Rev. B 55, 2331 (1997)), available online at lanl.arXiv.org, arXiv:cond-mat/9607195v1, Jul. 26, 1996, 17 pgs.
Fradkin, E. et al., "A Chern-Simons Effective Field-Theory for the Pfaffian Quantum Hall State", (preprint for article published at Nucl. Phys. B516, 704 (1998)), available online at lanl.arXiv.org, arXiv:cond-mat/9711087v1 [cond-mat.mes-hall], Nov. 11, 1997, 10 pgs.
Das Sarma, S. et al, "Topologically-Protected Qubits from a Possible Non-Abelian Fractional Quantum Hall State", (preprint for article published at Phys. Rev. Lett. 94, 166802, (2005)), available online at lanl.arXiv.org, arXiv:cond-mat/0412343v2 [cond-mat.mes-hall], Dec. 22, 2004, 5 pgs.
Stern, A. et al., "Proposed Experiments to probe the non-abelian v=5/2 quantum hall state", (preprint for article published at Phys. Rev. Lett. 96, 016802, (2006)), available online at lanl.arXiv.org, arXiv:cond-mat/0508447v3 [cond-mat.mes-hall], Sep. 25, 2005, 5 pgs.
Bonderson, P. et al, "Detecting Non-Abelian Statistics in the v = 5/2 Fractional Quantum Hall State", (preprint for article published at

(56) References Cited

OTHER PUBLICATIONS

Phys. Rev. Lett. 96, 016803, (2006)), available online at lanl.arXiv. org, arXiv:cond-mat/0508616v3 [cond-mat.mes-hall], Feb. 4, 2006, 5 pgs.

Willett, R.L. et al., "Measurement of filling factor 5/2 quasiparticle interference with observation of charge e/4 and e/2 period oscillations", Proc. Natl. Acad. Sci. U.S.A., vol. 106, No. 22, (2009), pp. 8853-8858.

Willett, R.L. et al., "Alternation and interchange of e/4 and e/2 period interference oscillations as evidence for filing factor 5/2 non-Abelian quasiparticles", (preprint for article published at Phys. Rev. B 82, 205301 (2010)), available online at: arXiv.org/abs/0911.0345, Jul. 2, 2010, 27 pgs.

Wan, X. et al., "Fractional quantum Hall effect at $v = 5/2$: Ground states, non-Abelian quasiholes, and edge modes in a microscopic model", (preprint for article published at Phys. Rev. B 77, 165316, (2008)), available online at lanl.arXiv.org, arXiv.0712.2095v3 [cond-mat.mes-hall], May 29, 2008, 20 pgs.

Bishara, W. et al, "Interferometric signature of non-Abelian anyons", Physical Review B 80, (2009), pp. 155303-1-155303-14.

Bishara, W. et al., "Odd-even crossover in a non-Abelian $v = 5/2$ interferometer", Physical Review B 80, (2009), 155304-1-155304-12.

Rosenow, B. et al , "Exact Solution for Bulk-Edge Coupling in the Non-Abelian $v = 5/2$ Quantum Hall interferometer", (preprint for article published at Phys. Rev. B 80, 155305, (2009)), available online at lanl.arXiv.org, arXiv:0906.0310v1 [cond-mat.mes-hall], Jun. 1, 2009, 12 pgs.

Willett, R.L. et al., "Confinementof fractional quantum Hall states in narrow conducting channels", Applied Physics Letters 91, 052105, (2007); pgs. cover sheet, 052105-1-052105-3.

Willett, R.L. et al., "Magnetic field-tuned Aharonov-Bohm oscillations and evidence for non-Abelian anyons at $v = 5/2$", (preprint for article published at Phys. Rev. Lett. 111, p. 186401 and supplemental material available at http://link.aps.org/supplemental/10.1103/PhysRevLett.111.186401), available online at lanl.arXiv.org, arXiv.org, arXiv:1301.2639v1 [cond-mat.mes-hall], Jan. 12, 2013, 10 pgs.

Zhang, Y. et al., "Distinct Signatures for Coulomb Blockade and Aharonov-Bohm Interference in Electronic Fabry-Pérot Interferometers", (preprint for article published at Phys. Rev. B 79, 241304, (2009)), available online at lanl.arXiv.org, arXiv:0901.0127v1 [cond-mat.mes-hall], Dec. 31, 2008, 4 pgs.

Ofek, N. et al., "Role of interactions in an electronic Fabry-Perot interferometer operating in the quantum Hall effect regime", Proc. Natl. Acad. Sci. U.S.A., vol. 107, No. 12, Mar. 23, 2010, pp. 5276-5281.

McClure III, D.T., Ph. D. Thesis, "Interferometer-Based Studies of Quantum Hall Phenomena", Harvard University, (May 2012), available online at http://qdev.nbi.ku.dk/student_theses/pdf_files/McClure_Thesis.pdf_copy/, pp. i-xvi and 1-167.

Levin, M. et al., "Particle-hole symmetry and the Pfaffian state", (preprint for article published at Phys. Rev. Lett. 99, 236806, (2007)), available online at lanl.arXiv.org, arXiv:0707.0483v1 [cond-mat.mes-hall], Jul. 3, 2007, 5 pgs.

Lee, S.-S. et al., "Particle-Hole Symmetry and the $v = 5/2$ Quantum Hall State", (preprint for article published at Phys. Rev. Lett. 99, 236807, (2007)), available online at lanl.arXiv.org, arXiv:0707.0478v1 [cond-mat.mes-hall], Jul. 3, 2007, 5 pgs.

Willett, R.L. et al., "Aharonov-Bohm effect and coherence length of charge e/4 quasiparticles at 5/2 filing factor measured in multiple small Fabry-Perot interferometers", available online at lanl.arXiv.org, arXiv:1301.2594, Jan. 11, 2013, 31 pgs.

Rosenow, B. et al., "Telegraph noise and the Fabry-Perot quantum Hall interferometer", (preprint for article published at Phys. Rev. B 85, 201302. (2012)). available online at lanl.arXiv.org, arXiv:1111.6475v2 [cond-mat.mes-hall], Jan. 6, 2012, 8 pgs.

Sasaki, Takahiro et al., "Novel Many-Body Transport Phenomenon in Coupled Quantum Wires", IEEE Transactions on Nanotechnology, vol. 3, No. 1, Mar. 2004, pp. 110-114.

Supplementary European Search Report, EP Application No. 12853516.8, Mailed Jul. 3, 2015, 4 pgs.

\* cited by examiner

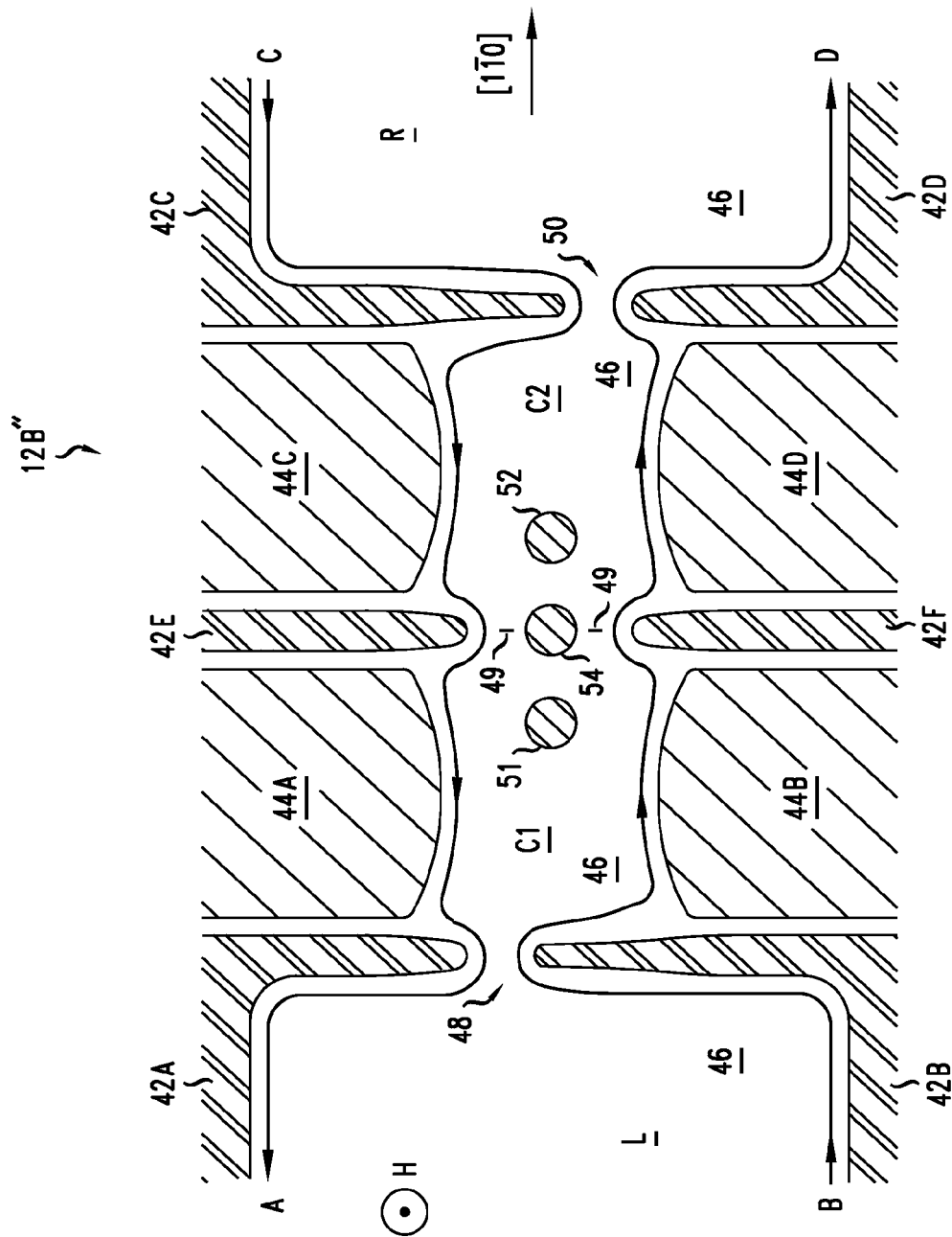

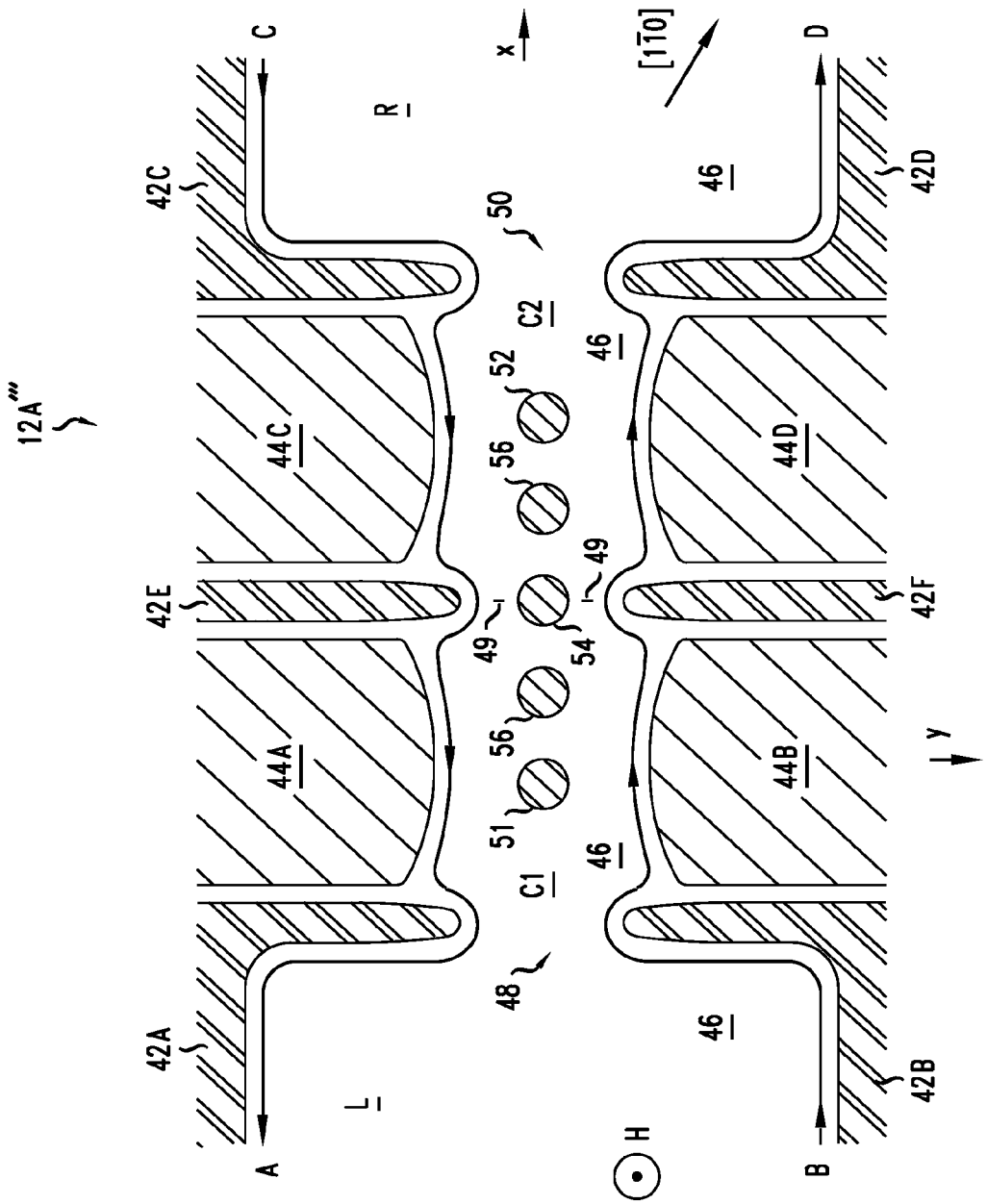

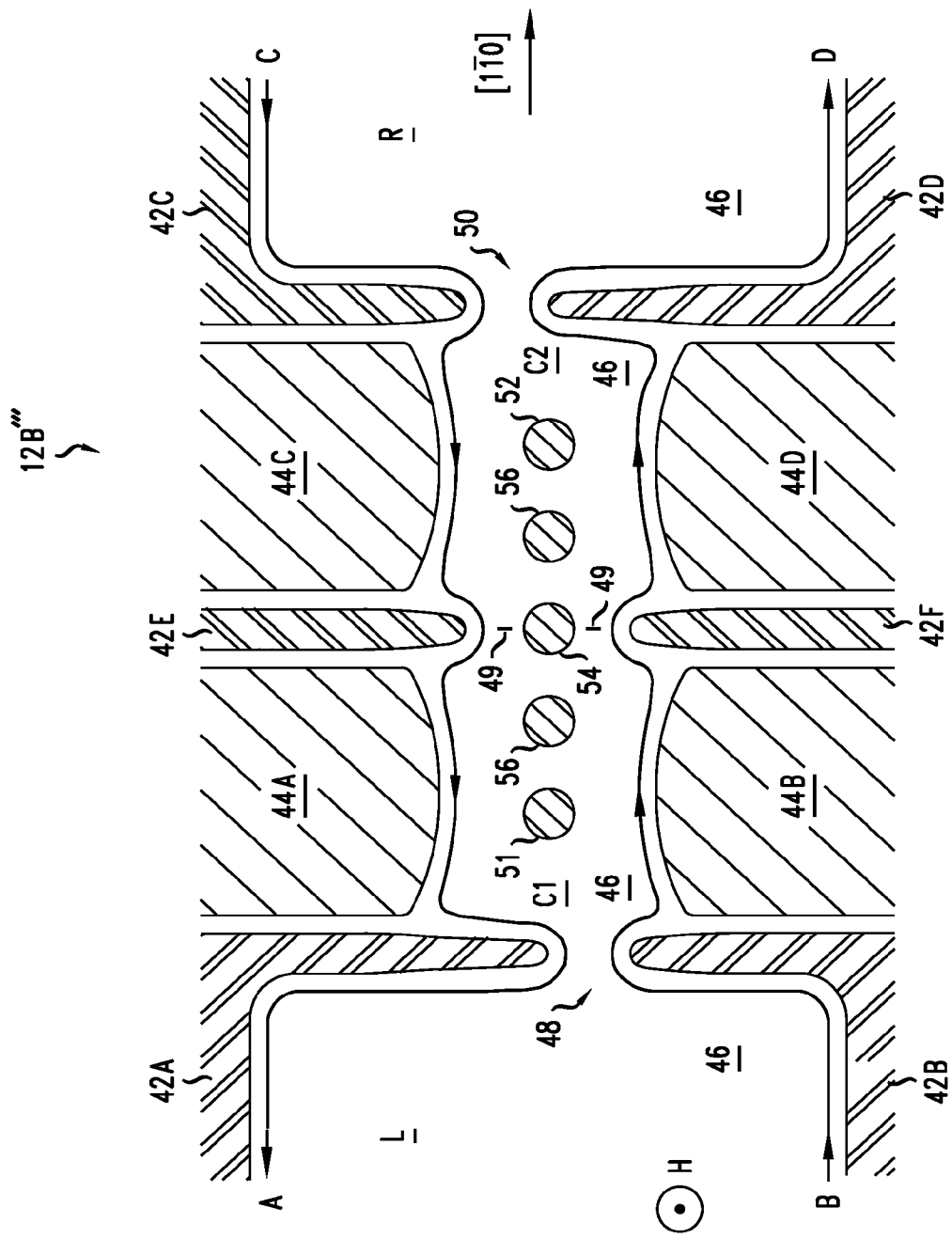

QUANTUM WELL DEVICE WITH LATERAL ELECTRODES

This application is a divisional of U.S. application Ser. No. 13/349,056, filed on Jan. 12, 2012, and claims the benefit of U.S. provisional application No. 61/566,357 filed on Dec. 2, 2011.

BACKGROUND

Technical Field

The invention relates generally to semiconductor quantum well devices and to methods for making and/or using such devices.

Discussion of the Related Art

This section introduces aspects that may be helpful to facilitating a better understanding of the inventions. Accordingly, the statements of this section are to be read in this light and are not to be understood as admissions about what is prior art or what is not prior art.

The fractional quantum Hall effect (FQHE) produces a set of special equilibrium states caused by collective effects between charge carriers in strong external magnetic fields. The special equilibrium states occur at special filling values of magnetic Landau levels, which occur in an external magnetic field. In such special equilibrium states, a trapped two-dimensional charge carrier gas (2DCCG) can behave as an incompressible fluid droplet, and currents may be transported by such a gas via excitations on the edge(s) of the fluid droplet.

Some FQHE systems may provide realizations of quantum computers for which multi-excitation states obey nonabelian statistics. For that reason, such multi-excitation states may be used to represent states of a qubit in a quantum computer. The topological nature of nonabelian statistics may protect such states from being perturbed in a physical system. For that reason, such excitation states may enable realizations of quantum computers in which susceptibilities to calculational errors are much lower than in other realizations of quantum computers.

SUMMARY

One embodiment is an apparatus that includes a substrate having a planar top surface, a sequence of crystalline semiconductor layers located on the top planar surface, and first and second sets of electrodes located over the sequence. The sequence of crystalline semiconductor layers has a two-dimensional (2D) quantum well therein. The first set of electrodes border opposite sides of a lateral region of the sequence and are controllable to vary a width of a non-depleted portion of the quantum well along the top surface. The second set of electrodes border first and second channels between the lateral region and first and second adjacent lateral areas of the sequence and are controllable to vary widths of non-depleted segments of the quantum well. The electrodes are located such that straight lines connecting the first and second lateral areas via the channels either pass between one of the electrodes and the substrate or are misaligned to an effective [1 $\bar{1}$ 0] lattice direction of the sequence of crystalline semiconductor layers.

In any of the above apparatus, the sequence may be substantially oriented along an actual [0 0 1] lattice direction of the semiconductor layers and the effective [1 $\bar{1}$ 0] lattice direction may be an actual [1 $\bar{1}$ 0] lattice direction of the layers.

In any of the above apparatus, the sequence may include a set of group III-V semiconductor alloys.

In any of the above apparatus, the electrodes may be located such that the straight lines are misaligned to the effective [1 $\bar{1}$ 0] lattice direction by at least 10 degrees.

In any of the above apparatus, the apparatus may further include, at least, two point-like electrodes located over the lateral region.

In any of the above apparatus, the electrodes of the second set may be operable to back scatter an edge current propagating along one edge of a FQHE droplet in the quantum well to an opposite edge of said FQHE droplet.

In any of the above apparatus, another set of the electrodes may be located over the sequence and be located adjacent opposite sides of a second lateral region of the sequence. The two lateral areas are disjoint, and some of the electrodes are controllable to vary a width along the top surface of a non-depleted segment of a channel in the quantum well between the two lateral regions. Some such apparatus may further include, at least, one point-like electrode located over each of the two lateral regions. Some such apparatus may further include a bridge electrode located over the sequence between the point-like electrodes and between a pair of gating electrodes, wherein the bridge electrode is operable to transport a localized FQHE excitation between the point-like electrodes.

In another embodiment, a method includes confining a FQHE droplet of 2DCCG to central and external lateral regions of a semiconductor layer sequence and channels of the semiconductor layer sequence. The channels connect the central lateral regions to the external lateral regions, and each straight line connecting the external lateral regions via the channels either traverses a 2DCCG-depleted region or is misaligned with the effective [1 $\bar{1}$ 0] lattice direction of the semiconductor layer sequence. The method also includes voltage-biasing a first electrode located over a part of the FQHE droplet in one of the central regions to locally trap a charged quasiparticle excitation therein.

In some embodiments, the above method may further include transferring another charged quasiparticle excitation from the first electrode to a second electrode located over a laterally distant second part of the FQHE droplet. The laterally distant part is located in another of the central lateral regions.

In some embodiments, any of the above methods may further include changing a voltage-biasing of a top electrode that controls a channel located between the first and second electrodes such that a quasiparticle or edge excitation back scatters between two edges of the FQHE droplet.

In some embodiments, any of the above methods may further include determining a value of a FQHE state produced by the step of locally trapping.

In some embodiments, any of the above methods, the sequence is oriented along an actual [0 0 1] lattice direction of semiconductor layers of the sequence, and the effective [1 $\bar{1}$ 0] lattice direction is an actual [1 $\bar{1}$ 0] lattice direction of the layers.

BRIEF DESCRIPTION OF THE FIGURES

FIGS. 4A and 4B are top views of alternate embodiments of planar structures for manipulating excited states of a FQHE droplet, e.g., with the setup of FIG. 1;

FIGS. 5A and 5B are top views of alternate embodiments of planar structures for manipulating excited states of a FQHE droplet, e.g., with the setup of FIG. 1;

In the Figures and text like reference numbers refer to functionally and/or structurally similar elements.

In the Figures, the relative dimensions of some features may be exaggerated to more clearly illustrate apparatus therein.

Herein, various embodiments are described more fully by the Figures and the Detailed Description of Illustrative Embodiments. Nevertheless, the inventions may be embodied in various forms and are not limited to the specific embodiments described in the Figures and the Detailed Description of the Illustrative Embodiments.

DESCRIPTION OF THE ILLUSTRATIVE EMBODIMENTS

U.S. provisional application No. 61/566,357, which was filed on Dec. 2, 2011 by Robert L. Willett, is incorporated herein by reference in its entirety.

Herein, effective [1 $\bar{1}$ 0] lattice directions of a crystalline layer refer to the actual [1 $\bar{1}$ 0] lattice direction of the layer and a [1 $\bar{1}$ 0]-like growth direction of the layer. A [1 $\bar{1}$ 0]-like growth direction is a direction along a growth surface of the crystalline layer for which epitaxial growth was relatively faster than for other directions along said growth surface. A surface morphology of such a layer often includes unit-cell or atomic scale terracing or larger scale lines, which are predominantly aligned along such a [1 $\bar{1}$ 0]-like growth direction. As an example, for an $Al_xGa_{[1-x]}As$ layer epitaxially grown along the layer's actual [0 0 1] lattice direction and having alloy parameter x that satisfies 0≤x≤1, such lines or unit-cell or atomic scale terraces are often dominantly observed as being aligned along the actual [1 $\bar{1}$ 0] lattice direction of the layer.

Figure 1:
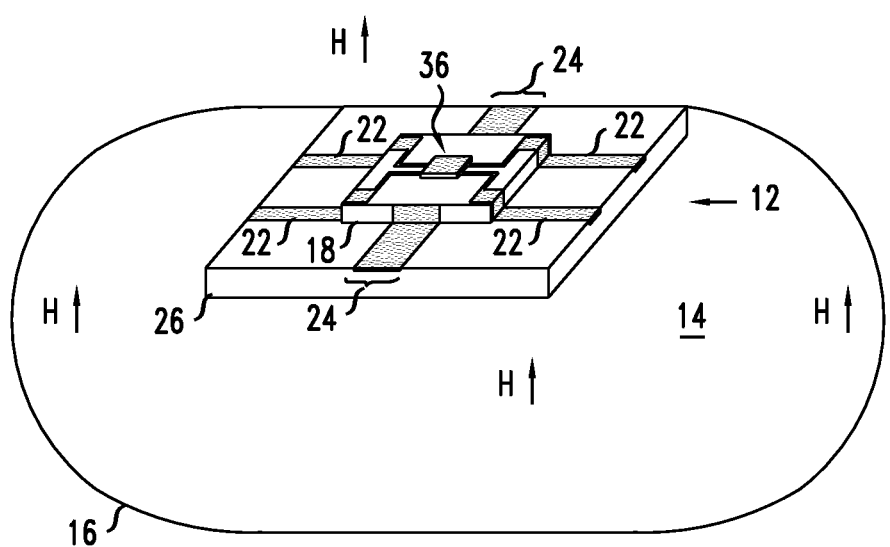
FIG. 1 is an oblique view schematically illustrating a setup for maintaining and manipulating excited states in a FQHE droplet of a two-dimensional charge-carrier gas (2DCCG)

FIG. 1 illustrates a hardware setup 10 for manipulating excited states of a Fractional Quantum Hall Effect (FQHE) droplet, e.g., by interfering edge excitations of the FQHE droplet. The hardware setup 10 includes a planar semiconductor device 12, a low-temperature cooling system 14, and a magnet 16.

The hardware setup 10 may be usable, e.g., to manipulate excitations of FQHE fluid of charge carriers in a strong magnetic field. For such exemplary uses, the planar semiconductor device 12 may laterally confine a droplet of a two-dimensional charge carrier gas (2DCCG) in Landau levels of an external magnetic field, H, e.g., for various selected filling factors of said levels. For filling factors greater than 2, e.g., in the open range of (2, 4), the planar semiconductor device 12 may be useable to create and/or manipulate excitations of a FQHE fluid that may obey nonabelian statistics, e.g., at filling factors of about 5/2, 12/5, or 7/2. In some embodiments, such FQHE states may provide representations of a qubit in a quantum computer. In particular, the hardware setup 10 may be useable to produce, change, and/or check the value of such representations of a qubit. For example, the individual states of a qubit may correspond to different current-carrying states of a FQHE droplet, e.g., the different edge states of such a FQHE droplet.

In the hardware setup 10, the semiconductor device 12 includes a layer sequence 18, current carrying and/or voltage measurement leads 22, electrical control leads 24, and a crystalline substrate 26. The layer sequence 18 includes a two-dimensional (2D) quantum well structure for vertically confining a 2DCCG. The semiconductor device 12 also includes top operating electrodes 36 for laterally confining a portion of an incompressible FQHE droplet of the 2DCCG. The top electrode 36 may also be usable to manipulate lateral edges and/or excitations of said FQHE droplet.

In the hardware setup 10, the layer sequence 18 is a sequence of crystalline semiconductor layers located over or directly on a planar surface of the substrate 26. The sequence of semiconductor layers forms the 2D quantum well. The layer sequence 18 has a planar top surface and individual crystalline semiconductor layers therein typically extend parallel to said planar top surface. In the sequence, the individual semiconductor layers may be, e.g., doped and/or undoped alloys of group III-V semiconductor. For example, the sequence may include layers of gallium arsenide (GaAs) and aluminum gallium arsenide, i.e., $Al_xGa_{[1-x]}As$ layers where the alloy parameter "x" may vary from layer-to-layer. In such embodiments, the sequence may extend, e.g., along a [0 0 1] lattice direction of individual III-V semiconductor layers so that an actual [1 $\bar{1}$ 0] lattice direction thereof lies approximately along the planar top surface of the sequence. The dopant atoms are preferably distant from the semiconductor layer(s) confining the 2DCCG. That is, the sequence of semiconductor layers is preferably modulation doped so that said dopant atoms are located far from and less perturb the confined 2DCCG.

In the hardware setup 10, the top operating electrodes 36 are located laterally to the FQHE droplet, i.e., laterally along the top surface of the layer sequence 18. The top operating electrodes 36 are connected to enable the control and manipulation of a FQHE droplet of the vertically confined 2DCCG. The top operating electrodes 36 can be used to vary the lateral area of a portion of such a FQHE droplet, i.e., along the top surface of the layer sequence 18. The top operating electrodes 36 can also be used to back scatter edge excitations on such a FQHE droplet, and/or to cause and control interference of such edge excitations. In some embodiments, the top operating electrodes 36 can initialize and/or change the state of a qubit that is represented by the current state of such a FQHE droplet.

In the setup 10, the low-temperature cooling system 14 is able to cool the planar structure 18 to temperatures low enough to produce FQHE states, e.g., at filling factors of 5/2, 12/5, and/or 7/2. In particular, the low-temperature cooling system 14 may be able to cool the planar structure 18 to temperatures below 150 milli-Kelvin (mK), e.g., 50 mK to 150 mK; preferable to temperatures below 100 mK, e.g., 100 mK to about 50 mK; and possibly to temperatures below 50 mK, e.g., about 20 mK. The low-temperature cooling system 14 may include, e.g., a conventional $He^3$, $He^4$ dilution refrigerator, for producing such cooling.

In the hardware setup 10, the magnet 16 can produce a moderately strong external magnetic field, H, near and normal to the top surface of the layer sequence 18, e.g., a magnetic field whose magnitude is about 5 Tesla or more. The magnetic field, H, is large enough to generate desired FQHE states in the 2DCCG, e.g., states in which the magnetic Landau levels have filling factors of about 5/2, 12/5, or 7/2. The magnetic field, H, may be, e.g., substantially uniform over the layer sequence 18.

In the hardware setup 10, the current carrying and voltage measurement leads 22 may carry currents and/or enable voltage measurements on the laterally confined 2DCCG in the 2D quantum well, e.g., via a conventional 4-terminal arrangement. The control leads 24 can be operated to partially or completely deplete selected lateral regions of the 2D quantum well of the 2DCCG so that a FQHE droplet of the 2DCCG is confined to a selected lateral region of the 2D quantum well. Herein, depletion refers to a condition where a lateral region of a semiconductor structure or 2D quantum well is depleted of charge carriers of a 2DCCG, which is confined thereto.

Figure 2A:
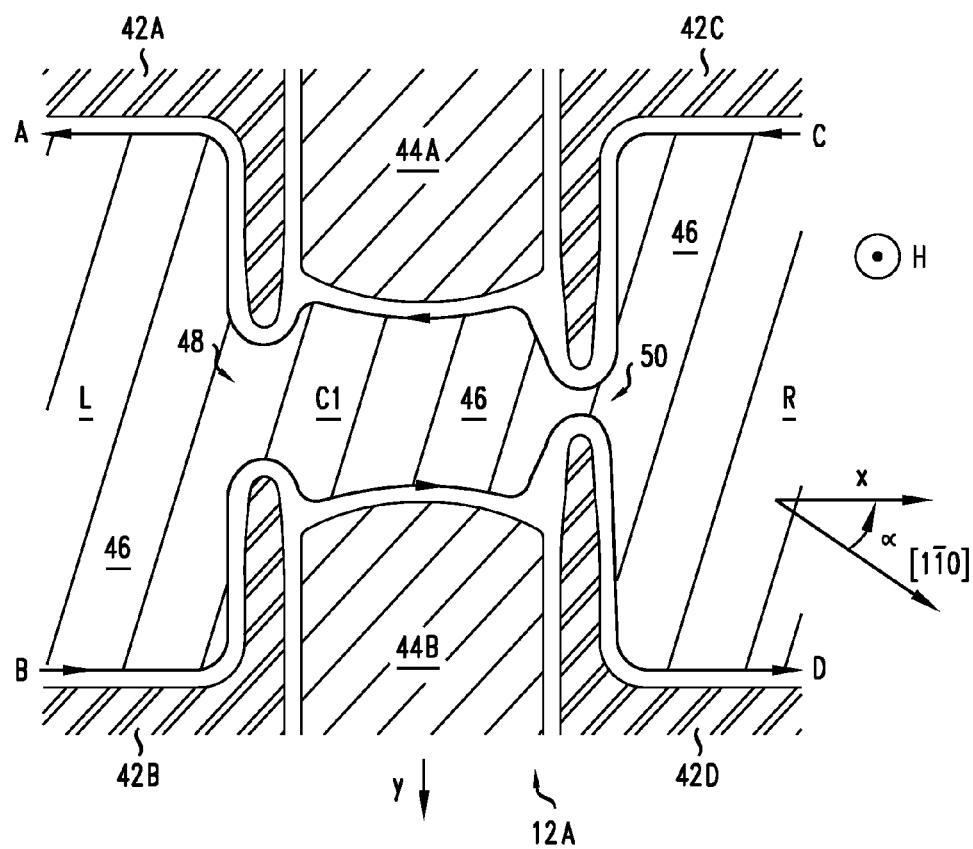
FIG. 2A is a top view of one embodiment of a planar structure for manipulating excited states of a FQHE droplet, e.g., with the setup of FIG. 1.
Figure 2B:
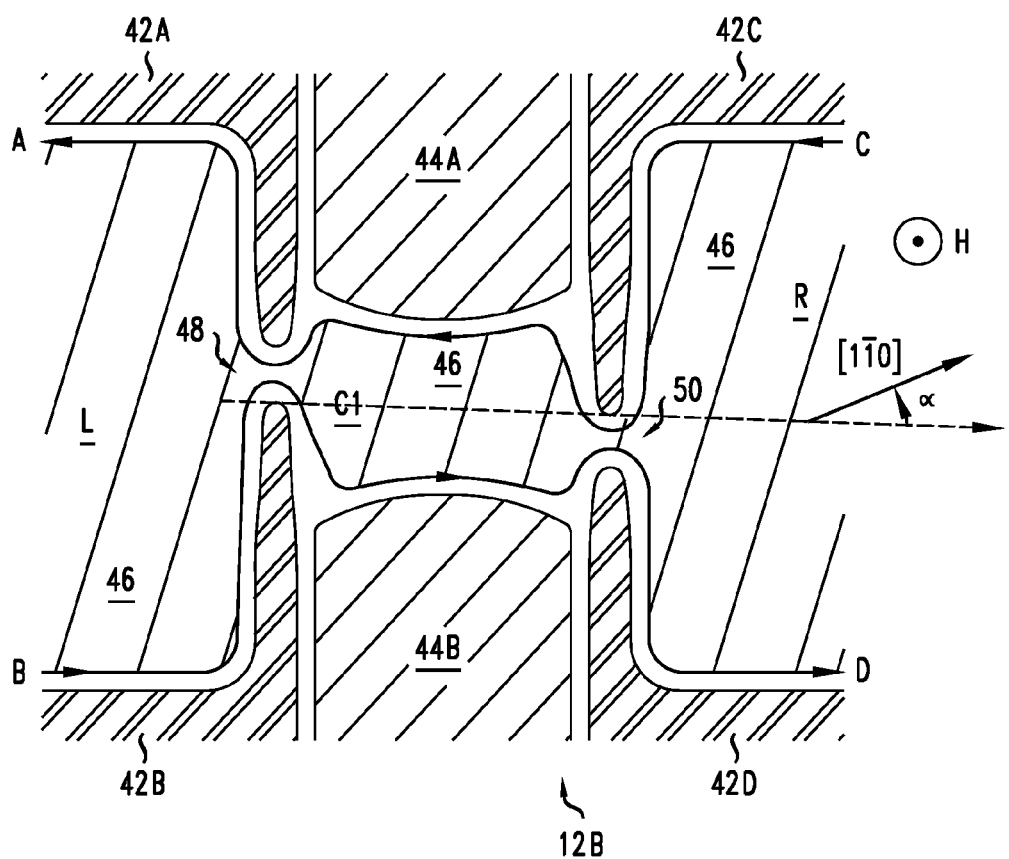
FIG. 2B is a top view of another embodiment of a planar structure for manipulating excited states of a FQHE droplet, e.g., with the setup of FIG. 1.
Figure 2C:
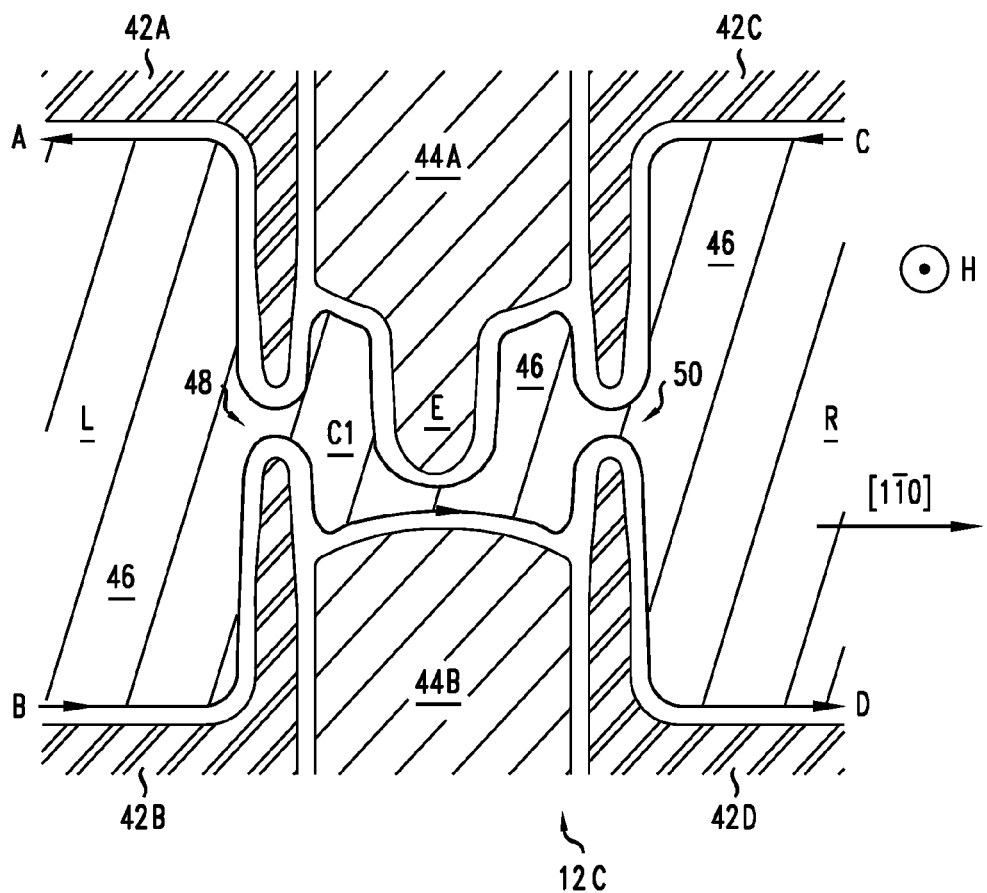
FIG. 2C is a top view of yet another embodiment of a planar structure for manipulating excited states of a FQHE droplet, e.g., with the setup of FIG. 1.

FIGS. 2A-2C illustrate various alternate embodiments 12A, 12B, 12C for the planar structure 12 of FIG. 1. From bottom-to-top, each of the planar structures 12A-12C includes the crystalline substrate 26 and a layer sequence including, at least, a lower barrier layer, an adjacent well layer, and an adjacent upper barrier layer. That is, the layer sequence includes, at least, crystalline semiconductor layers that form the 2D quantum well.

Over the top surface of the layer sequence, the planar structures 12A-12C include a first set of top electrodes 44A, 44B and a second set of top electrodes 42A, 42B, 42C, 42D. The top electrodes 44A, 44B of the first set are located adjacent opposite sides of a lateral central region C1 of the layer sequence. The top electrodes 42A-42D of the second set are located adjacent lateral sides of first and second channels 48, 50 that connect the central region C1 to respective left and right lateral regions L and R of the layer sequence. That is, the boundaries of the top electrodes 44A-44B and 42A-42D define the lateral boundaries of the central, left and right regions C1, L, R of the layer sequence. In particular, the central, left, and right regions C1, L, R and channels 48, 50 are defined as lateral regions of the layer sequence that are not located between a portion of any of the top electrodes 44A-44B, 42A-42D and the substrate 26 (not shown in FIGS. 2A-2C).

The semiconductor layers of the layer sequence are crystalline and may have, e.g., an effective [1 $\bar{1}$ 0] lattice direction oriented along interfaces thereof and oriented perpendicular to the direction along which the sequence, which may extend along the [0 0 1] lattice direction. With respect to said effective [1 $\bar{1}$ 0] lattice direction, the top electrodes 42A-42D, 44A-44B have special forms and locations. The forms and locations of the top electrodes 42A-42D, 44A-44B cause the first and second channels 48, 50 to have special relative locations. In particular, any straight line connecting the lateral left region L to the lateral right region R via the first and second channels 48, 50 either is substantially misaligned with respect to the effective [1 $\bar{1}$ 0] lattice direction, e.g., misaligned by 10 degrees or more or even by 30 degrees or more, or passes between part of one of the top electrodes 42A-42D, 44A-44B and the substrate 26 of FIG. 1. That is, all such lines either are substantially misaligned with the special effective [1 $\bar{1}$ 0] lattice direction or pass under a part of one of the top electrodes 42A-42D, 44A-44B.

The above-described constraints on the locations and forms of the top electrodes 42A-42D and 44A-44B are believed to likely help to enable the planar structures 12A-12C to be used to produce and/or manipulate a FQHE droplet 46 of a 2DCCG. In particular, the inventor believes that constructing the top electrodes 42A-42D, 44A-44B to satisfy the above-described constraints will usually cause the planar structures 12A-12C to be less likely to produce striped states of the 2DCCG when subjected to the temperatures and some magnetic field intensities used to produce FQHE fluids. In such a striped state, the laterally confined 2DCCG typically has a lateral stripe in a first integer QHE state, e.g., at a filling factor of two, and has an adjacent lateral stripe in a second integer QHE state at a different integer filling factor. In other types of 2D quantum well devices, the inventor believes that producing such striped states may be easier when the surface averaged, filling factor is greater than 1, e.g., in the open range (2, 4). When such a striped state forms, a quantum well structure would typically not be useful for producing FQHE states in the 2DCCG. Thus, it is usually not desirable that the laterally confined 2DCCG has a tendency to form such a striped state when such a 2D quantum well structure is to be used for FQHE applications, e.g., to make a representation of a qubit for a quantum computer.

In FIGS. 2A-2C, the various planar structures 12A-12C illustrate different ways to satisfy the above constraints on the top electrodes 42A-42D, 44A-44B. That is, the planar structures 12A-12C are believed to provide different layouts for the top electrodes 42A-42D, 44A-44B, which would likely hinder formation of such striped states under conditions used to form FQHE droplets in a laterally confined 2DCCG.

Referring to FIG. 2A, the planar structure 12A is constructed so that each straight line connecting the first and second channels 48, 50 is approximately oriented along an "x" direction, wherein the "x" direction is substantially misaligned with respect to the effective [1 $\bar{1}$ 0] lattice direction of the layer sequence extending along the [0 0 1] lattice direction. FIG. 2A illustrates the effective [1 $\bar{1}$ 0] lattice direction as being oriented along the top surface of the planar structure 12A. In such an example, any straight line between the channels 48, 50 is misaligned with the above-described the effective [1 $\bar{1}$ 0] lattice direction by, at least, an angle of α where α may be 10 degrees or more, e.g., 10 to 90 degrees, or may be 30 degrees or more, e.g., 30 to 90 degrees. Indeed, the misalignment may even be so large that the effective [1 $\bar{1}$ 0] lattice direction is along the top surface of the planar structure 12A and is oriented along a "y" direction, which is orthogonal to the "x" direction.

Referring to FIG. 2B, the planar structure 12B is constructed so that each straight line connecting the left region L to the right region R via the central region C1 has a segment passing under one of the top electrodes 42A-42D of the second set. In particular, the top electrodes 42A-42D are asymmetrically formed so that any straight line connecting the channels 48, 50, e.g., the dotted line, is substantially misaligned with respect to the effective [1 $\bar{1}$ 0] lattice direction that is along the top surface, i.e., misaligned by an angle cc. Again, the misalignment angle cc may be 10 degrees or more, e.g., 10 to 90 degrees, or even 30 degrees or more, e.g., 30 to 90 degrees.

Referring to FIG. 2C, the planar structure 12C is constructed so that any straight line connecting the first and second channels 48, 50 has a segment passing under one of the top electrodes 44A of the first set. In particular, the top electrode 44A has an extension E that reduces the width of a section of the lateral central region C1 so that any straight line connecting the left and right lateral regions L, R via the channels 48, 50 passes under said extension E even if said line is approximately along the effective [1 $\bar{1}$ 0] lattice direction of the semiconductor layers.

In some alternate embodiments of the planar structure 12C, the effective [1 $\bar{1}$ 0] lattice direction may also be substantially misaligned with respect to any such straight line connecting the first and second channels 48, 50.

Referring to FIGS. 2A-2C, the planar structures 12A-12C may have, e.g., a layer sequence of crystalline layers of different group III-V alloys. For example, the layer sequence may include an epitaxially grown $Al_xGa_{[1-x]}As$ lower barrier layer, an adjacent GaAs well layer, and an adjacent $Al_yGa_{[1-y]}As$ upper barrier layer, wherein 0<x, y<1. The layer sequence may extend along a [0 0 1] crystal lattice direction of the group III-V layers so that an actual [1 $\bar{1}$ 0] lattice direction is oriented along a planar top surface of the layer sequence, i.e., as illustratively shown in FIGS. 2A-2C or may extend along a different lattice direction, e.g., so that the effective [1 $\bar{1}$ 0] lattice direction is oriented along the planar top surface of the layer sequence.

The planar structures 12A-12C may be used to produce and/or manipulate a FQHE droplet 46 of a 2DCCG, wherein the FQHE droplet 46 is confined in a lateral portion of the 2D quantum well, e.g., in the central, left, and right lateral regions C1, L, R. In particular, to produce such a droplet, the 2DCCG may be subjected to a strong magnetic field, H, which is oriented normal to the top surface of the planar structure 12A-12C, while maintaining the planar structure 12A-12C at a very low temperature, e.g., in the setup 10 of FIG. 1. In such a situation, the FQHE droplet 46 can have an upper edge whose lateral extent is indicated by a smooth curved line running from C to A in FIGS. 2A-2C and can have a lower edge whose lateral extent is indicated by a smooth curved line running from B to D in FIGS. 2A-2C. The planar structures 12A-12C can control the locations of the lateral edges of the FQHE droplet 46 by the voltages applied to the channel-gating top electrodes of the second set, i.e., electrode pairs (42A, 42B) and (42C, 42D), and to the pair of lateral confining top electrodes (44A, 44B) of the first set.

In particular, voltages can be applied to the top electrodes 42A, 42B, 42C, 42D, 44A, 44B to deplete directly underlying regions of 2D quantum well and/or to deplete some regions of the 2D quantum well neighboring such underlying regions of the 2DCCG. For example, if the applied voltages produce a Coulomb potential repulsive for the charge carriers in the 2DCCG, the applied voltages produce a Coulomb potential that can confine a droplet of the 2DCCG, e.g., the FQHE droplet 46, to a lateral region of the 2D quantum well, e.g., to the lateral regions C1, L, and R. Indeed, some such applied voltages can also be used to manipulate the edges of such a laterally confined FQHE droplet of the 2DCCG. For example, if the charge carriers of the 2DCCG are electrons, increasing the magnitude of a negative voltage applied to one or more of the top electrodes 42A, 42B, 42C, 42D, 44A, 44B will increase the local depletion of trapped electrons near the one or more of the top electrodes 42A, 42B, 42C, 42D, 44A, 44B on which the magnitude of the applied negative voltage was increased. Thus, increasing magnitudes of such applied negative voltages will move the edges of such a laterally confined FQHE droplet 46 of a 2D electron gas further lateral from the edge(s) of the one or more of the top electrodes 42A, 42B, 42C, 42D, 44A, 44B on which the magnitude(s) of the applied negative voltage(s) is/are increased.

In various embodiments, the three pairs of top electrodes, i.e., pairs (42A, 42B), (42C, 42D), and (44A, 44B) may be separately biased, to enable separate control of different lateral regions of the FQHE droplet 46. The lateral confining, top electrodes 44A, 44B control the lateral width of the part of the FQHE droplet 46 confined to the lateral central region C1. Varying the voltage bias to the lateral confining, top electrodes 44A and 44B can move the respective upper and lower lateral boundaries of the part of the FQHE droplet 46 in the lateral central region C1. The channel-gating, top electrodes 42A, 42B control the lateral width of the non-2DCCG-depleted portion of the channel 48, which connects the part of the FQHE droplet 46 in the lateral central region C1 with the part of the FQHE droplet 46 in the lateral left region L. The channel-gating, top electrodes 42C, 42D control the lateral width of the non-2DCCG-depleted portion of the channel 50 connecting the part of the FQHE droplet 46 in the lateral central region C1 with the part of the FQHE droplet 46 in the lateral right region R.

The voltage applied to each pair of channel-gating, top electrodes of the second set, i.e., pairs (42A, 42B) and (42C, 42D), can also control the probability that edge excitations of the FQHE droplet 46 tunnel between the upper edge C-A and lower edge B-D of the FQHE droplet 46. When the width of the non-2DCCG-depleted portion of one of the channels 48, 50 is reduced, edge excitations of the FQHE droplet 46 that approach the one of the channels 48, 50 may be back scattered. Such a back scattering can make such an edge excitation tunnel to the opposite edge of the FQHE droplet 46 and/or reverse the edge excitation's generally rightwards or leftwards direction of propagation in FIGS. 2A-2C. Thus, the voltage at each pair of channel-gating, top electrodes (42A, 42B) and (42C, 42D) may be adjusted to either cause such back scatterings of edge excitations to the opposite edges of the FQHE droplet 46 or to forbid such back scatterings.

Based on such back scatterings, the planar structures 12A-12C can be used to interfere quasiparticle or edge excitations of the FQHE droplet 46. For example, the two pairs of channel-gating, top electrodes, i.e., pairs (42A, 42B) and (42C, 42D), may be set to cause such back scatterings at both channels 48, 50. Then, the edge or excitations incoming from the left on the lower edge of the FQHE droplet 46 can be back scattered at both the left channel 48 and the right channel 50. Such edge excitations backscattered at different ones of the channels 48, 50 can interfere on the upper edge of the FQHE droplet 46 in the lateral left region L. The form of such interference may be varied by changing the area of the part of the FQHE droplet confined to the lateral central region C1, e.g., by varying the voltage applied to the confining top electrodes 44A, 44B. In particular, the wavefunction associated with quasiparticle or edge excitations back scattered at the right channel 50 receives an added phase fixed by the number of quasiparticle excitations and magnetic flux quanta in the part of the FQHE droplet 46 in the lateral central region C1. Thus, changing the area of said centrally confined part of the FQHE droplet 46 via the voltage applied to the lateral confining electrodes 44A, 44B can change the form of the interference between such back scatterings of edge or quasiparticle excitations at the two channels 48, 50.

The top electrodes 42A-42D and 44A-44B may substantially surround an embodiment of the lateral central region C1 whose area is about 2 μm² or less. The channel-gating, top electrodes (42A, 42B) and (42C, 42D) may have exemplary widths of about 1 μm, and the opposing distal tips of each pair of said gating top electrodes (42A, 42B) and (42C, 42D) may be separated by exemplary gaps of about 0.6 μm or less. At low temperatures, the planar structures 12A-12C may be operable to interfere edge excitations back scattered at the channels 48, 50 and may be usable, e.g., to indicate the presence of quasiparticles of charge e/2, e/4, or other suitable value in the FQHE fluid 46 for a Landau level filling factor of 5/2, 12/5, and/or 7/2.

FIGS. 3A, 3B, 4A, 4B, 5A, and 5B illustrate embodiments 12A', 12B', 12A", 12B", 12A''', and 12 B''' of the planar structure 12 illustrated in FIG. 1, e.g., specific embodiments of the planar structures 12A-12C illustrated in FIGS. 2A-2C. The planar structures 12A'-12B', 12A"-12B" and 12A'''-12B''' have top electrodes 42A-42D, 44A-42F, which may be operated to produce and/or manipulate a FQHE droplet 46 of a 2DCCG trapped in a lateral portion of a 2D quantum well. Such a FQHE droplet 46 may be produced in a strong normal magnetic field, H, at very low temperatures, e.g., as already discussed with respect to the hardware setup 10 of FIG. 1.

Each planar structure 12A', 12B', 12A", 12B", 12A''', 12 B''' includes a layer sequence of crystalline semiconductor layers over or directly on a planar surface of a crystalline substrate (not shown) as described with respect to the planar structures 12, 12A-12C of FIGS. 1 and 2A-2C. Each layer sequence also includes a 2D quantum well therein.

Each planar structure 12A', 12B', 12A", 12B", 12A''', 12 B''' includes a first set of laterally confining, top electrodes 44A-44D and includes a second set of channel-gating, top electrodes 42A-42F. The top electrodes 44A-44D, 42A-42F of the first and second sets are located over lateral portions of the layer sequence. Pairs of the laterally confining, top electrodes 44A, 44B of the first set are located adjacent opposite sides of two lateral central regions C1, C2 of the layer sequence. Pairs of the channel-gating, top electrodes 42A-42D of the second set are located adjacent a first channel 48 or a second channel 50. The channels 48, 50 connect the central regions C1, C2 to lateral left and right lateral regions L, R of the layer sequence. A pair of the channel-gating, top electrodes 42E, 42F is located adjacent another channel 49 connecting the two central regions C1, C2. The central, left, and right lateral regions C1, C2, L, R and the various ones of the above-discussed channels 48-50 are lateral regions of the sequence, which are not located between one of the top electrodes 44A-44D, 42A-42F and the substrate (i.e., substrate 26 of FIG. 1). In particular, the edges of the top electrodes 44A-44D, 42A-42F define boundaries of the central, left, and right lateral regions C1, C2, L, R.

The semiconductor layers of the sequence are crystalline and have an effective [1 1̄ 0] lattice direction along interfaces thereof, i.e., along a direction perpendicular to the orientation of the sequence. Due to special forms and relative locations of the top electrodes 42A-42F and 44A-44D, the first and second channels 48, 50 are relatively located so that any straight line connecting the left region L to the right region R via the first and second channels 48, 50 either is misaligned with said effective [1 1̄ 0] lattice direction, e.g., by 10 degrees or more or by 30 degrees or more, or passes between one of the top electrodes 42A-42F, 44A-44D and the substrate, i.e., passes under a portion said one of the top electrodes 42A-42F, 44A-44D.

The above-described constraints on the relative locations and forms of the top electrodes 42A-42F, 44A-44D may be advantageous when using the planar structures 12A', 12B', 12A", 12B", 12A''', 12B''' to laterally confine and manipulate a FQHE droplet 46 of a 2DCCG. In particular, the inventor believes that constructing the top electrodes 42A-42F, 44A-44D to satisfy the above-discussed constraints can reduce the probability that a striped state will form in the droplet 46, i.e., at very low temperatures and high intensities of the magnetic field, H, e.g., at Landau level filling factors greater than 1. Under the above conditions, it is undesirable that a lateral region of the 2DCCG be in a striped state, because a striped state is typically not a FQHE state and thus, is typically unsuitable for use to represent a qubit for a quantum computer.

Figure 3A:
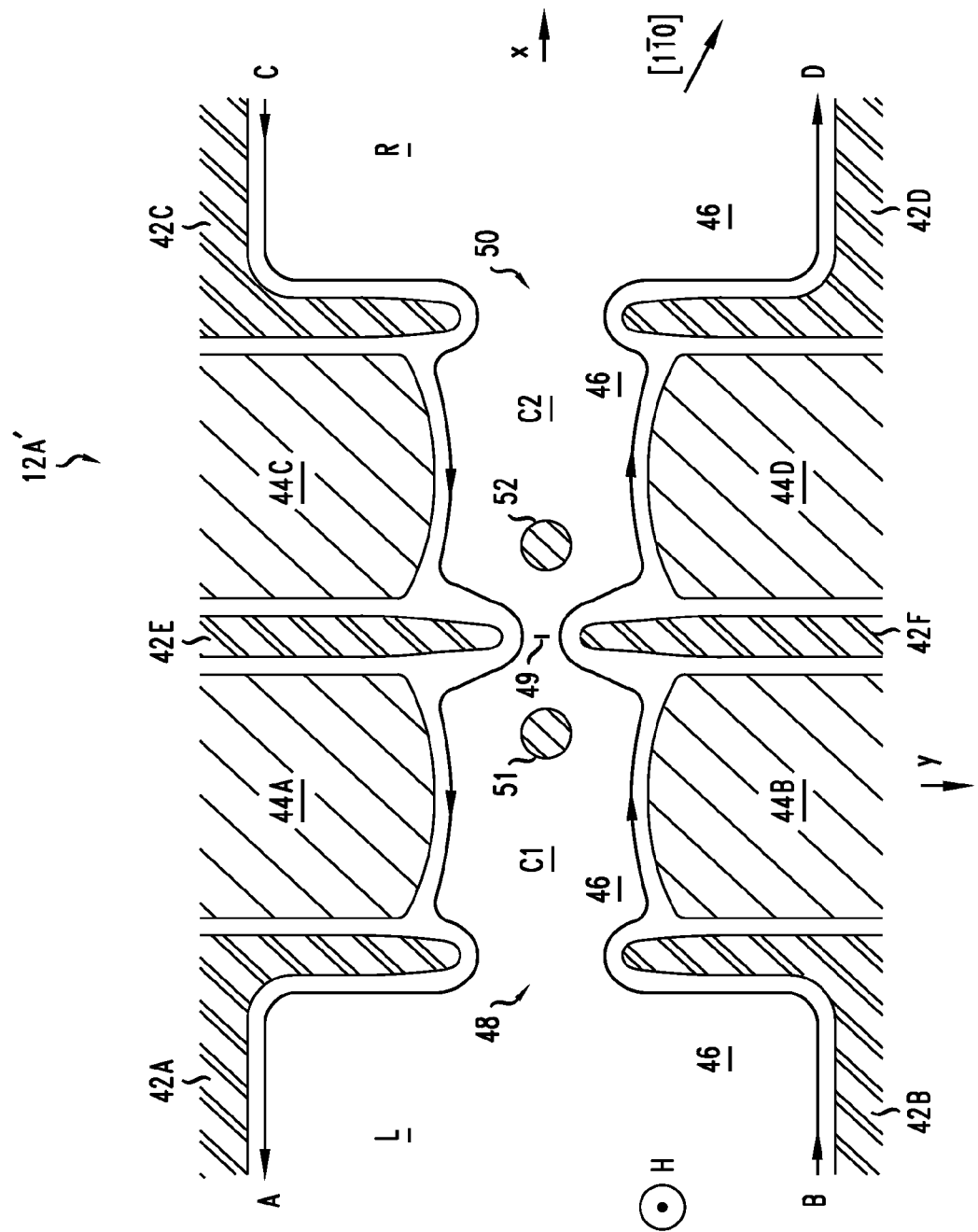
FIGS. 3A and 3B are top views of alternate embodiments of planar structures for manipulating excited states of a FQHE droplet, e.g., with the setup of FIG. 1.
Figure 4A:
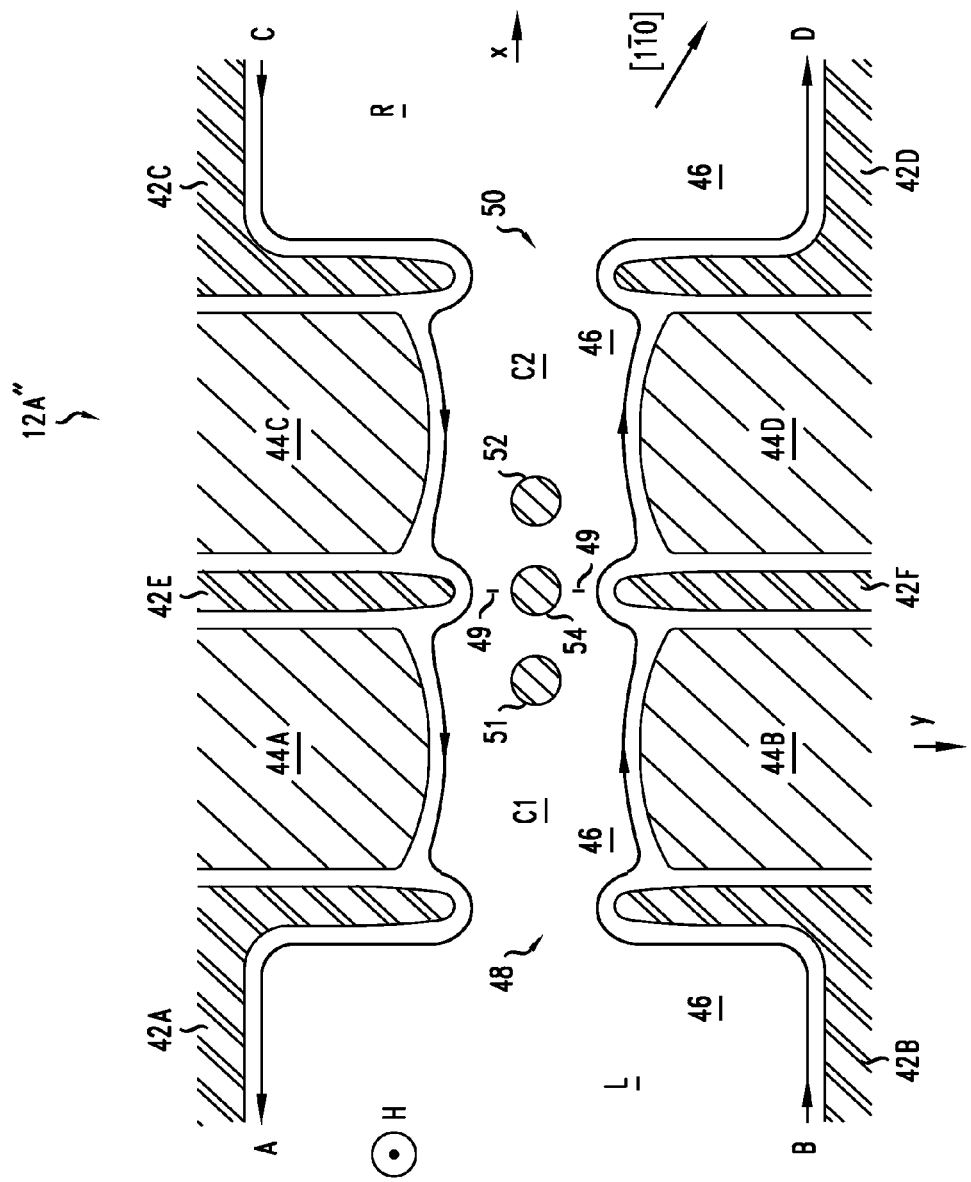

Referring to FIGS. 3A, 4A, and 5A, the planar structures 12A', 12A", 12A''' are constructed so that straight lines connecting the lateral left and right regions L, R via the channels 48, 49, 50 are approximately oriented along an "x" direction, which is substantially misaligned with respect to the effective [1 1̄ 0] lattice direction. For example, the effective [1 1̄ 0] lattice direction of the semiconductor layers may be approximately along the top surface of the sequence and be misaligned with the "x" direction by 10 degrees or more or by 30 degrees or more. Indeed, the misalignment may be such that said effective [1 1̄ 0] lattice direction is oriented along a "y" direction, which is orthogonal to the "x" direction.

Figure 3B:
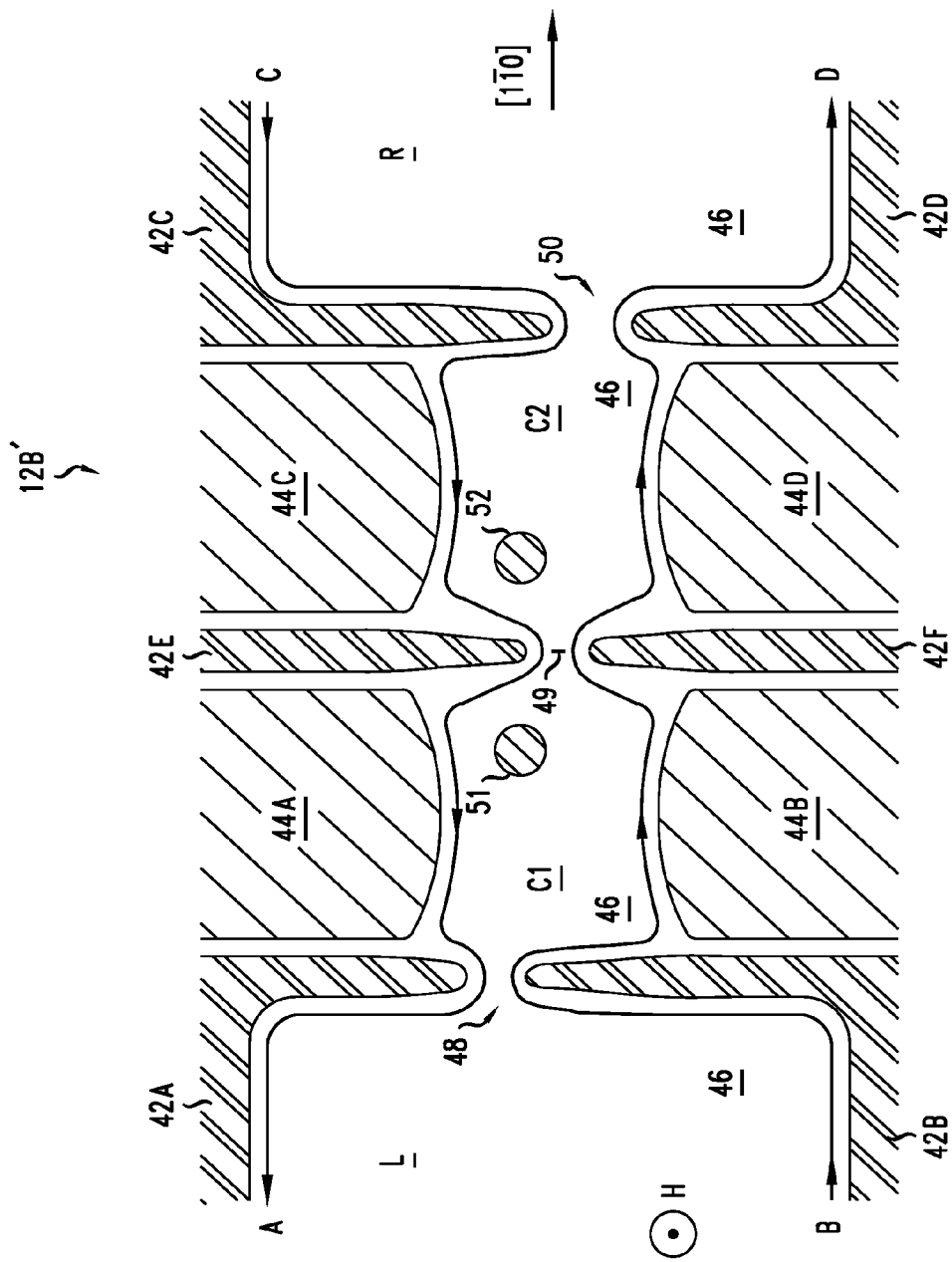

Referring to FIGS. 3B, 4B, and 5B, the planar structures 12B', 12B", 12B''' are constructed so that each straight line connecting the lateral left region L to the lateral right region R via the central regions C1 and C2 either has a segment passing under one of the channel-gating, top electrodes 42A-42F of the second set or is substantially misaligned with said effective [1 1̄ 0] lattice direction. In the illustrated examples, some of the channel-gating, top electrodes 42A-42F are asymmetrically formed so that straight lines connecting the channels 48, 50 are misaligned with respect to the effective [1 1̄ 0] lattice direction, which is oriented along the top surface of the layer sequence of semiconductor layers.

Each planar structure 12A'-12B', 12A"-12B", 12A'''-12B''' may also separately control two relatively lateral portions of the FQHE droplet 46 confined therein. The first lateral portion of the FQHE droplet 46 is confined by the top electrodes 42A, 42B, 44A, 44B, 42E, 42F, which border the first lateral central region C1, and the second lateral portion of the FQHE droplet 46 is confined by the top electrodes 42C, 42D, 44C, 44D, 42E, 42F, which border the second lateral central region C2. The first pair of laterally confining, top electrodes 44A, 44B may be separately voltage biased to enable the separate control of lateral upper and lower edges of the portion of the FQHE droplet 46 in the first lateral central region C1. The second pair of laterally confining, top electrodes 44C, 44D may be separately voltage biased to enable separate control of lateral upper and lower edges of the portion of the FQHE droplet 46 in the second lateral central region C2. The left pair of channel-gating, top electrodes 42A, 42B may also be separately voltage biased to enable separate control of the width of the non-2DCCG-depleted portion of channel 48 between the first lateral central region C1 and lateral left region L. The second pair of channel-gating, top electrodes 42C, 42D may also be separately voltage biased to enable separate control of the width of the non-2DCCG-depleted portion of channel 50 between the second lateral central region C2 and lateral right region R. The third pair of channel-gating, top electrodes 42E, 42F may also be separately voltage biased to enable separate control of the width of the non-2DCCG-depleted portion of the channel 49 connecting the first and second central lateral regions C1, C2.

The planar structures 12A', 12B', 12A", 12B", 12A''', 12B''' also include one or more top localized or point-like electrodes 51, 52 in each central lateral region C1, C2. Each top point-like electrode 51, 52 can be separately voltage biased to selectively and locally hold a quasiparticle excitation, e.g., a composite fermion excitation, at the point-like electrodes 51, 52 when the FQHE droplet 46 is laterally confined in the 2D quantum well. For example, at the Landau level filling factor of 5/2, the point-like electrode(s) may be biased with voltage(s) that correspond to quasiparticle excitation(s) with charge e/2 or e/4, wherein the quasiparticle excitation(s) are localized about the point-like electrode(s).

Herein, a top point-like electrode, e.g., electrode 51 or 52, is an electrode whose tip region is surrounded by a non-2DCCG-depleted lateral region during operation. For example the lateral regions may be annular portions of the central regions C1 and C2, in which a portion of a FQHE fluid droplet 46 may be laterally confined. Such top point-like electrodes have down-pointing tip regions whose areas are substantially smaller than the areas of said surrounding lateral regions, e.g., the lateral central regions C1, and C2. The area of the tip region of such a point-like electrode may be, e.g., two or more times as small or five or more times as small as the area of such surrounding lateral regions.

Referring to FIGS. 4A, 4B, 5A, and 5B, the planar structures 12A", 12B", 12A''', and 12B''' also include one or more top bridging electrodes 54, 56, which are located between the top point-like electrodes 51, 52 and near the distal tips of the central channel-gating, top electrodes 42E, 42F of the third set. The top bridging electrodes 54, 56 are positioned to controllably aid the completion of a first path for quasiparticle or edge excitations to propagate between the point-like electrodes 51, 52 and also to controllably aid the completion a second path for quasiparticles or edge excitations to propagate between the upper and lower edges of the FQHE droplet 46 near the distal tips of the third set of paired channel-gating, top electrodes 42E, 42F.

The one or more top bridging electrodes 54, 56 can facilitate selective control of whether quasiparticle or edge excitations will propagate between the top point-like electrodes 51, 52 or will propagate between the upper and lower edges of the FQHE droplet 46 near the third pair of channel-gating, top electrodes 42E, 42F. To selectively transfer a quasiparticle or edge excitation between the top point-like electrodes 51, 52, the channel-gating, top electrodes 42E, 42F may be maintained at voltages for which the upper and lower edges of the FQHE droplet 46 are far from the one or more top bridging electrodes 54, 56. In such a state, a quasiparticle or edge excitation may tunnel between the top point-like electrodes 51, 52, but typically such an excitation will have, at most, a very low probability of tunneling between the upper and lower edges of the FQHE droplet 46 near the central, third pair of channel-gating, top electrodes 42E, 42F. To selectively transfer a quasiparticle or edge excitation between the upper and lower edges of the FQHE droplet 46 near the central, third pair of channel-gating, top electrodes 42E, 42F, the third pair of channel-gating, top electrodes 42E, 42F may biased at a voltage for which the upper and lower edges of the FQHE droplet 46 are near one or more of the top bridging electrodes 54, 56. In such a state, a quasiparticle or edge excitation may tunnel between the upper and lower edges of the FQHE droplet 46 near the third pair of channel-gating, top electrodes 42E, 42F whereas a quasiparticle or edge excitation may have a very low probability to tunnel between the top point-like electrodes 51, 52.

The top bridging electrode(s) 54, 56 may aid in selecting between different paths for quasiparticle or edge excitation transfers for several reasons. First, the top bridging electrode(s) 54, 56 may reduce the largest distance a quasiparticle or edge excitation tunnels in one jump while being transferred between the top point-like electrodes 51, 52. Second, the geometry of the top bridging electrode(s) 54, 56 may lower distance(s) for individual tunnelings of a quasiparticle or edge excitation between the top point-like electrodes 51, 52 as compared to distances for tunneling of the quasiparticle or edge excitation between the upper and lower edges of the FQHE droplet 46 near the central, third pair of channel-gating, top electrodes 42E, 42F. Third, the top bridging electrode(s) 54, 56 may enable applications of bias voltages that aid in transferring quasiparticle or edge excitations between the top point-like electrodes 51, 52. For example, during such a left-to-right transfer, when a quasiparticle or edge excitation is at the middle top bridging electrode 54, the left top bridging electrode 56 may be voltage-biased to produce a force to push the excitation towards the right top bridging electrode 56. Also, when the quasiparticle or edge excitation is at the right top bridging electrode 56, the middle top bridging electrode 54 may be voltage-biased to produce a force to push the quasiparticle or edge excitation towards the right top point-like electrode 52. Similarly, during a right-to-left transfer, the right top bridging electrode 56 may be voltage biased to produce a force to push a quasiparticle or edge excitation from the middle top bridging electrode 54 towards the left top bridging electrode 56. Also, when the quasiparticle or edge excitation is at the left top bridging electrode 56, the middle top bridging electrode 54 may be voltage biased to produce a force to push the quasiparticle or edge excitation towards the left top point-like electrode 51. Thus, the top bridging electrodes 54, 56 may both aid in selecting between the paths for transferring quasiparticle or edge excitations and/or to aid in reducing the times needed for such transfers.

Figure 6A:
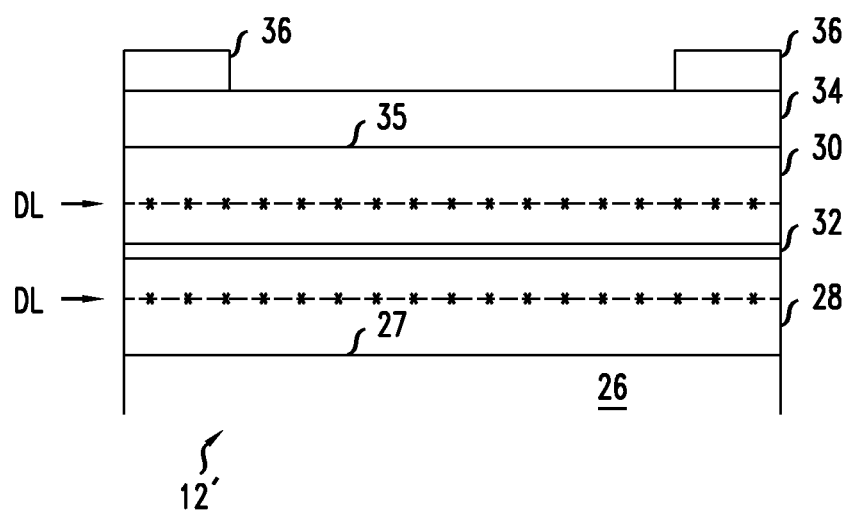
FIG. 6A is a cross-sectional view of one sequence of layers for the planar structure of FIG. 1, e.g., the planar structures of FIGS. 2A, 2B, 2C, 3A, 3B, 4A, 4B, 5A and 5B.

FIG. 6A illustrates one embodiment 12' for the planar structure 12 of FIG. 1. The planar structure 12 has a bottom-to-top sequence of layers that includes a crystalline semiconductor substrate 26, a crystalline lower semiconductor barrier layer 28, a crystalline semiconductor well layer 32, a crystalline upper semiconductor barrier layer 30, a top dielectric layer 34, and top electrodes 36. The crystalline semiconductor barrier layers 28, 30 and well layer 32 form the 2D quantum well.

The 2D quantum well structure may be modulation doped by placing dopant atoms far from the semiconductor well layer 32, e.g., in one or two thin dopant layers (DLs) deep in the semiconductor barrier layer(s) 28, 30. Such a vertical separation aids to Coulomb shielding the 2DCCG from the charged ion cores of ionized ones of the dopant atoms. A symmetric placement of a dopant layer (DL) on each side of the semiconductor well layer 32 may also enable a larger separation between such ion cores and the trapped 2DCCG thereby enabling a better shielding of the ion cores for a desired density of the 2DCCG.

The top dielectric layer 34 can electrically insulate the top electrodes 36 from the underlying sequence of semiconductor layers and/or may reduce the production of traps and other localized defects on top semiconductor surface 35 during fabrication. Flat portions of the top electrodes 36, e.g., electrodes 42A-42F, 44A-44D of various already-discussed embodiments, may rest on an upper sublayer of dielectric layer 34, and point-like projections of the top electrodes 36, e.g., the electrodes 51, 52, 54, 56 of various already-discussed embodiments, may project into holes etched into upper and/or lower sublayer(s) of the dielectric layer 34.

Figure 6B:
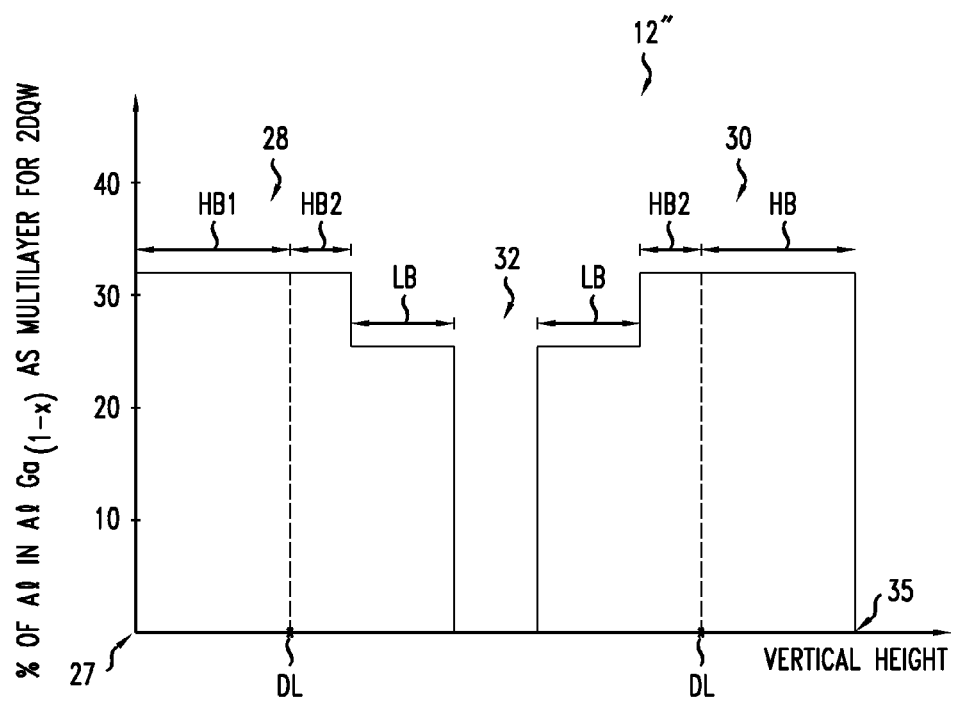
FIG. 6B graphs the aluminum (Al) percentage as a function of vertical depth in a dimensional (2D) quantum well structure of an embodiment of the planar structure of FIG. 6A formed of alloys of aluminum (Al) gallium (Ga), and/or arsenide (As)

FIG. 6B illustrates a vertical profile of semiconductor alloys in a specific embodiment 12" of the planar structure 12' of FIG. 6A. The specific embodiment 12" is based on an epitaxially grown AlGaAs/GaAs/AlGaAs 2D quantum well structure.

In the specific embodiment 12", the crystalline substrate 26 includes a GaAs wafer substrate and a buffer stack of GaAs and/or AlAs layers epitaxially grown on a (001) lattice surface of the GaAs wafer substrate, i.e., grown along the [0 0 1] lattice direction of the GaAs wafer substrate. The (001) lattice surface of the GaAs wafer substrate may be polished and/or cleaned by standard techniques prior to the epitaxial growth of the buffer stack thereon. The buffer stack may include a first thick layer of GaAs, e.g., about 50 nm to 200 nm and a stack of alternating GaAs and AlAs layers thereon, e.g., about 600 repetitions of GaAs and AlAs monolayers and/or bilayers. Such a buffer stack may reduce the undesired effects of surface defects in the GaAs wafer substrate on the 2D quantum well fabricated thereon and/or may reduce carrier leakage to the substrate 26.

In the specific embodiment 12", the layer sequence of crystalline semiconductor layers 28, 32, 30 are epitaxially grown on a (001) lattice surface 27 of the crystalline substrate 26. The different layers 28, 32, 30 of the layer sequence have different semiconductor alloy compositions that are produced by varying the relative percentages of aluminum (Al) and gallium (Ga) in the gas mixture during the relevant epitaxial growths. The various alloys have alloys of the form: $Al_xGa_{(1-x)}As$ where the concentration of Al varies between the layers and fixes the energy of the lower edge of the conduction band. In particular, the height of the lower edge of the conduction band is believed to be monotonic in the concentration of Al in such alloys. For that reason, the Al percentages of FIG. 6B qualitatively illustrate the potential energy topography for electrons in the various semiconductor layers of the 2D quantum well.

In the specific embodiment 12", the lower semiconductor barrier layer 28 is a multilayer epitaxially grown on the crystalline substrate 26. For this multilayer, the bottom-to-top structure is: an $Al_xGa_{(1-x)}As$ layer, HB1, with an alloy parameter x of about 0.323 and a thickness of about 110 nm; a thin n-type dopant layer (DL) of SiAs, e.g., a fraction of one or a few monolayers; an $Al_xGa_{(1-x)}As$ layer HB2 with an alloy parameter x of about 0.323 and a thickness of about 42 nm; and an $Al_{x'}Ga_{(1-x')}As$ layer LB with an alloy parameter x' of about 0.243 and a thickness of about 48 nm.

The lower Si doped layer DL may include, e.g., about $10^{12}$ dopant atoms per centimeter-squared.

In the specific embodiment 12", the crystalline semiconductor well layer 32 is a substantially undoped GaAs layer with a width of about 24 nm. The crystalline semiconductor well layer 32 is epitaxially grown on crystalline lower semiconductor barrier layer 28.

In the specific embodiment 12", the crystalline upper semiconductor barrier layer 30 is a multilayer epitaxially grown on the crystalline semiconductor well layer 32. The crystalline upper semiconductor layer 30 is a multilayer that substantially mirrors the crystalline lower semiconductor layer 28. For this multilayer, the bottom-to-top structure is: an $Al_{x'}Ga_{(1-x')}As$ layer LB with an alloy parameter x' of about 0.243 and a thickness of about 48 nm; an $Al_xGa_{(1-x)}As$ layer HB2 with an alloy parameter x of about 0.323 and a thickness of about 42 nm; a thin n-type dopant layer (DL) of SiAs, e.g., a fraction of one or a few monolayers; and an $Al_xGa_{(1-x)}As$ layer HB1 with an alloy parameter x of about 0.323 and a width of about 110 nm. The upper n-type doped layer DL is vertically separated from the semiconductor well layer 32 so that ion cores of dopant atoms less perturb the 2DCCG that is vertically confined to the 2D quantum well.

In example embodiments, the upper Si doped layer DL may also have of order $10^{12}$ dopant atoms per centimeter-squared. But, in the upper Si doped layer DL, the dopant atom density may be about 3 to about 4 times the value of dopant atom density in the lower Si doped layer DL, because the upper Si doped layer DL can also contribute charge carriers that neutralize dangling bonds at the exposed top surface 35 of the 2D semiconductor well structure 12" by combining with atoms thereat.

The crystalline semiconductor well layer 32 may be located, at least, about 200 nm below the top surface 35 of the layer sequence of semiconductor layers, e.g., to reduce undesired interactions between the trapped 2DCCG and localized defects on said top surface 35.

In the specific embodiment 12", the top dielectric layer 34 may be an amorphous dielectric layer. One embodiment of the top dielectric layer 34 is a silicon nitride layer having a thickness of about 40 nm or less.

In the specific embodiment 12", the operating top electrodes 36 may be patterned metallic layers, e.g., formed via conventional deposition and lithographic patterning processes. For example, the operating top electrodes 36 may be formed by an evaporation-deposition of aluminum to a thickness of about 60 nm on a resist patterned substrate followed by a lift off the resist and excess aluminum.

In alternate embodiments of the semiconductor layer sequence of FIGS. 6A-6B, the aluminum percentage in the $Al_xGa_{(1-x)}As$ alloy may have a different value in a layers adjacent to or surrounding the DL layers. Such different aluminum percentages can cause potentials of ionized dopant atoms to have longer tails. The longer tails are conventionally believed to be aid to delocalize randomly distributed charges associated with such ionized dopant atoms thereby possibly spatially smoothing interactions with the 2DCCG.

Other vertical layer sequences of semiconductor layers that may be suitable for the planar structure 12 of FIG. 1 and/or methods of making and using such layer sequences may be described in U.S. Pat. No. 7,960,714 and/or U.S. Patent Application Publication 20100308302. For example, such layer structures may have narrow shielding quantum wells located between the well layer 32 and the dopant layers DL. The U.S. Patent and U.S. Patent Application Publication cited in this paragraph are incorporated herein by reference in their entirety.

Figure 7:
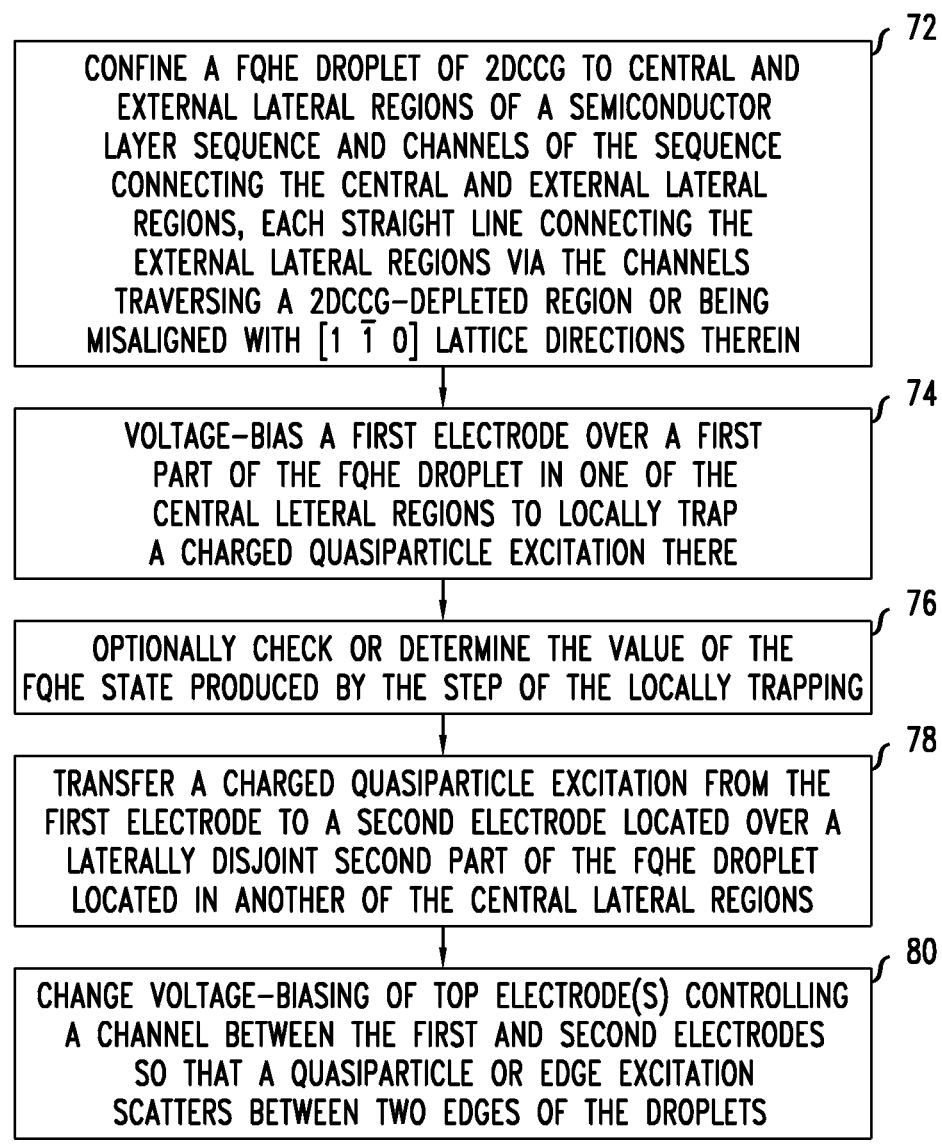
FIG. 7 is a flow chart schematically illustrating a method of manipulating excited states of a FQHE droplet, e.g., using the planar structures of FIGS. 2A, 2B, 2C, 3A, 3B, 4A, 4B, 5A and/or 5B in the setup of FIG. 1.

FIG. 7 schematically illustrates a method 70 for operating a device with a 2D quantum well structure where the 2D quantum well structure has central lateral regions, disjoint external lateral regions and channels connecting the central lateral regions to the external lateral regions, e.g., as in FIGS. 3A, 3B, 4A, 4B, 5A, and 5B. The central lateral regions, external lateral regions and channels form a continuous non-2DCCG-depleted portion of the 2D quantum well structure during operation, and these regions and channels are defined by laterally bordering sets of top electrodes, which can deplete remaining lateral regions of the 2D quantum well structure of the 2DCCG during operation. The 2D quantum well structure is formed in a semiconductor layer sequence located over or directly on a planar top surface of a substrate. The set(s) of top electrodes are constructed to reduce the probability of forming striped states of the 2DCCG in the central lateral regions during operation, e.g., as in the planar structures 12A-12C, 12A', 12B', 12A", 12B", 12A''', and 12B''' of FIGS. 2A, 2B, 3A, 3B, 4A, 4B, 5A, and 5B. In particular, the top electrodes are constructed so that straight lines connecting the external lateral regions of the 2D quantum well structure via the channels either pass between one of the top electrodes and the substrate, i.e., traverse a 2DCCG-depleted region during operation, or are substantially misaligned with the effective [1 $\bar{1}$ 0] lattice direction of the 2D quantum well structure. In the later case, the 2D quantum well structure may extend, e.g., approximately perpendicular to the [0 0 1] lattice direction of the semiconductor layers thereof.

The method 70 involves steps for initializing and manipulating a topological state of a FQHE droplet, e.g., the FQHE droplet 46 of FIGS. 3A, 3B, 4A, 4B, 5A, and 5B at a Landau level filling factor of about 5/2, 12/5, or 7/2. For example, the method 70 may be performed to store and/or change a qubit's state in a quantum computer where the qubit is represented with a FQHE droplet.

The method 70 includes preparing a laterally confined FQHE droplet of 2DCCG in a 2D quantum well of a semiconductor layer sequence, e.g., the FQHE droplet 46, at a Landau level filling factor ν of about 5/2, 12/5, or 7/2 (step 72). The FQHE droplet is laterally confined to central lateral regions, external lateral regions, and channels connecting these lateral regions in the semiconductor layer sequence. The preparing step 72 is performed such that each straight line connecting the external lateral regions via the channels either traverses a 2DCCG-depleted region or is misaligned with the effective [1 $\bar{1}$ 0] lattice direction of the semiconductor layer sequence. In the later case, the effective [1 $\bar{1}$ 0] lattice direction may be about perpendicular to the orientation of the layer sequence.

The preparing step 72 includes cooling and subjecting the 2DCCG to a suitably strong, normally oriented, magnetic field, H, e.g., with the setup 10 of FIG. 1.

The preparing step 72 involves laterally confining the FQHE droplet of the 2DCCG by voltage-biasing top electrodes located over lateral bordering portions of the semiconductor layer sequence, e.g., the top electrodes 42A-42F, 44A-44D of FIGS. 3A, 3B, 4A, 4B, 5A and 5B. The laterally confining includes depleting regions of the 2D quantum well structure lateral to the central lateral regions where the 2DCCG is to be laterally confined. For example, the act of laterally confining involves depleting those regions located around the part of the FQHE droplet 46 in the central regions C1 and C2 and the channels 48, 49, 50 in FIGS. 3A, 3B, 4A, 4B, 5A, and 5B of the 2DCCG. The top electrodes may be electrically insulated from the semiconductor layer sequence with the 2D quantum well structure by a dielectric layer, e.g., the dielectric layer 34 of FIG. 6A. The step of laterally confining a FQHE droplet of the 2DCCG may also include appropriately setting the density, ρ, and filling factor, ν, of the confined part of the 2DCCG by charge-depleting part of the edge of said confined FQHE droplet and appropriately setting a magnetic field strength, H. In the FQHE droplet, the filling factor ν is given by, e.g., ρhc/(|e|H) where h is Planck's constant, e is the electron charge, c is the speed of light, and ρ is the density of the charge carriers in the laterally confined part of the 2DCCG, e.g., in the lateral central cavities C1 and C2 of FIGS. 3A, 3B, 4A, 4B, 5A, and 5B.

The method 70 includes voltage-biasing a first electrode over a first laterally confined part of the FQHE droplet, i.e., a part located in a first of the central lateral regions, to locally trap an e/2 or other suitable charge quasiparticle excitation at the first electrode, e.g., at the point-like electrode 51 in the first lateral central region C1 of FIGS. 3A, 3B, 4A, 4B, 5A, and 5B (step 74). The voltage-biasing step 74 may, e.g., initialize the FQHE device to a first state for a qubit that is represented by the FQHE droplet.

The method 70 may optionally include checking or determining the value of the FQHE state produced by the step 74 of locally trapping the charged quasiparticle excitation at the first electrode, e.g., at the point-like electrode 51 in the first central lateral region C1 of FIGS. 3A, 3B, 4A, 4B, 5A, and 5B (step 76). This optional step 74 of checking or determining may be performed by measuring longitudinal conductances associated with edge excitations that back scatter between upper and lower edges of the confined FQHE droplet. In particular, the interference between different back scattered edge excitation states will depend on whether the edge excitations do or do not propagate around the laterally confined part of the FQHE droplet where the e/2 or other suitable charge quasiparticle excitation is localized. Some such measurements may be described, e.g., in an article published at Physical Review Letters, vol. 94 (2005) pages 166802-1 to 166802-4. Said article is incorporated herein by reference in its entirety.

The method 70 includes transferring an e/4 or other suitable charge quasiparticle excitation from the first electrode to a second electrode, which is located over a second laterally distant part of the FQHE droplet, i.e., a part of the FQHE droplet located in the second central lateral region (step 78). For example, the second electrode may be the top point-like electrode 52 in the second lateral central region C2 of FIGS. 3A, 3B, 4A, 4B, 5A, and 5B. The transferring step 78 may include changing the voltage-biasing of the first and/or second electrodes. The transfer step 78 leaves an e/4 or other suitable charge quasiparticle excitation at the first electrode. The transferred e/4 or other suitable charge quasiparticle may, e.g., be held under a tip of the other one of the top point-like electrodes 51, 52 of FIGS. 3A, 3B, 4A, 4B, 5A, and 5B.

The transferring step 78 may include changing bias voltage(s) at one or more top bridging electrodes, e.g., one or more of the top bridging electrodes 54, 56 of FIGS. 4A, 4B, 5A, and 5B to aid in transferring the e/4 or other suitable charge excitation. For example, the e/4 or other suitable charge quasiparticle may be temporally held or pushed by such bridging electrode(s) 54, 56 during part(s) of its transfer.

The method 70 includes then, changing the voltage-biasing of one or more of channel-gating top electrodes that control 2DCCG-depletion of a channel between the first and second electrodes so that an e/4 or other suitable charge quasiparticle or edge excitation back scatters between upper and lower edges of the FQHE droplet (step 80). For example, the step 80 may involve adjusting the voltage-biasing of the channel-gating, top electrodes 44E, 44F of FIGS. 3A, 3B, 4A, 4B, 5A, and 5B, which control the width of the FQHE droplet 46 in the channel 49. Changing the voltage-biasing of these channel-gating, top electrodes 44E, 44F may affect back scattering of edge excitations between the upper and lower edges A-C and B-D of the FQHE droplet 46 in FIGS. 3A, 3B, 4A, 4B, 5A, and 5B.

At the step 80, the back scattering the e/4 or other suitable charge quasiparticle or edge excitation involves its propagation around one of the localized e/4 or other suitable charge quasiparticle excitations held at one of the first and second electrodes. But, the step 80 does not involve a propagation of said quasiparticle or edge excitation around the localized e/4 or other suitable charge quasiparticle excitation, which is held at the other of the first and second electrodes. For example, the back scattering may occur between portions of the upper and lower edges of the FQHE droplet 46 near the channel-gating, top electrodes 42E and 42F of FIGS. 3A, 3B, 4A, 4B, 5A, and 5B.

At the step 80, the transferring of the e/4 or other suitable charge quasiparticle between the two edges of the FQHE droplet may be aided by operating one or more top bridging electrodes, e.g., the top bridging electrode(s) 54, 56 of FIGS. 4A, 4B, 5A, and 5B. Such a transfer may also change, e.g., the state of a qubit stored by the FQHE device.

Some embodiments of the hardware setup 10 of Figure may form a quantum computer having an array of 2D quantum well structures. In such a quantum computer, each element of said array is operated as an individual qubit of the quantum computer. The individual qubit elements may be operated as qubits of a conventional of quantum computer. In such a quantum computer, each qubit element may include a lateral portion of a semiconductor layer sequence and set(s) of top electrodes as illustrated in the planar structures 12A', 12B', 12A'', 12B'', 12A''', 12B''' of FIGS. 3A, 3B, 4A, 4B, 5A and/or 5B. In such a quantum computer, the individual qubit elements may also include controllable voltage-biasing sources for operating the top gates thereof, e.g., as described in the method 70 of FIG. 7. In particular, such top electrodes may be separately operable to perform the operations of initialization, checking, and state changing of a portion of a FQHE droplet as described with respect to the method 70.

The inventions are intended to include other embodiments that would be obvious to one of skill in the art in light of the description, figures, and claims.

I claim:

1. A method, comprising:
   confining a FQHE droplet of 2DCCG to central and external lateral regions of a semiconductor layer sequence and channels of the semiconductor layer sequence, the channels connecting the central lateral regions to the external lateral regions, wherein each straight line connecting the external lateral regions via the channels either traverses a 2DCCG-depleted region or is misaligned with an effective [1 $\bar{1}$ 0] lattice direction of the semiconductor layer sequence; and
   voltage-biasing a first electrode located over a part of the FQHE droplet in one of the central regions to locally trap a charged quasiparticle excitation therein.

2. The method of claim 1, further comprising:
   transferring another charged quasiparticle excitation from the first electrode to a second electrode located over a laterally distant second part of the FQHE droplet, the laterally distant part being located in another of the central lateral regions.

3. The method of claim 2, further comprising:
   then, changing a voltage-biasing of a top electrode that controls a channel located between the first and second electrodes such that a quasiparticle or edge excitation back scatters between two edges of the FQHE droplet.

4. The method of claim 1, wherein each straight line connecting the external lateral regions via the channels either traverses a 2DCCG-depleted region or is substantially misaligned with the effective [1 $\bar{1}$ 0] lattice direction of the semiconductor layer sequence.

5. The method of claim 4, wherein the sequence is oriented along an actual [0 0 1] lattice direction of semiconductor layers of the sequence and the effective [1 $\bar{1}$ 0] lattice direction is an actual [1 $\bar{1}$ 0] lattice direction of the layers.

6. The method of claim 1, wherein each straight line connecting the external lateral regions via the channels either traverses a 2DCCG-depleted region or is misaligned by 10 degrees or more with respect to the effective [1 $\bar{1}$ 0] lattice direction of the semiconductor layer sequence.

7. The method of claim 6, wherein the sequence is oriented along an actual [0 0 1] lattice direction of semiconductor layers of the sequence and the effective [1 $\bar{1}$ 0] lattice direction is an actual [1 $\bar{1}$ 0] lattice direction of the layers.

8. The method of claim 1, wherein each straight line connecting the external lateral regions via the channels either traverses a 2DCCG-depleted region or is misaligned by 30 degrees or more with respect to the effective [1 $\bar{1}$ 0] lattice direction of the semiconductor layer sequence.

9. The method of claim 8, wherein the sequence is oriented along an actual [0 0 1] lattice direction of semiconductor layers of the sequence and the effective [1 $\bar{1}$ 0] lattice direction is an actual [1 $\bar{1}$ 0] lattice direction of the layers.

10. The method of claim 1, further comprising determining a value of a FQHE state produced by the step of locally trapping.

11. The method of claim 1, wherein the sequence is oriented along an actual [0 0 1] lattice direction of semiconductor layers of the sequence and the effective [1 $\bar{1}$ 0] lattice direction is an actual [1 $\bar{1}$ 0] lattice direction of the layers.

* * * * *